US012622113B2

(12) United States Patent
Kim

(10) Patent No.: US 12,622,113 B2
(45) Date of Patent: May 5, 2026

(54) LIGHT EMITTING DEVICE WITH IMPROVED RADIATION DISTRIBUTION AND METHOD OF MAKING THEREOF

(71) Applicant: SAMSUNG ELECTRONICS CO., LTD., Suwon-si (KR)

(72) Inventor: Brian Kim, Santa Clara, CA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 735 days.

(21) Appl. No.: 18/057,914

(22) Filed: Nov. 22, 2022

(65) Prior Publication Data

US 2023/0378404 A1    Nov. 23, 2023

Related U.S. Application Data

(60) Provisional application No. 63/282,247, filed on Nov. 23, 2021.

(51) Int. Cl.
H10H 20/855 (2025.01)
H01L 25/075 (2006.01)
H10H 20/825 (2025.01)

(52) U.S. Cl.
CPC ....... H10H 20/855 (2025.01); H01L 25/0753 (2013.01); H10H 20/825 (2025.01)

(58) Field of Classification Search
CPC .. H10H 20/855; H10H 20/825; H10H 20/851; H01L 25/0753; H01L 25/167; G02B 3/0056; G02B 19/0028; G02B 19/0066; G02B 2207/123
See application file for complete search history.

(56) References Cited

U.S. PATENT DOCUMENTS

| 9,884,763 | B1 | 2/2018 | Scher et al. |
| 10,185,150 | B2 | 1/2019 | Wang et al. |
| 10,304,375 | B2 | 5/2019 | Chen et al. |
| 10,304,811 | B2 | 5/2019 | Zhang et al. |

(Continued)

FOREIGN PATENT DOCUMENTS

| CN | 112054131 A | 12/2020 |
| JP | 2007-276183 A | 10/2007 |
| JP | 2021-012251 A | 2/2021 |

OTHER PUBLICATIONS

Kress, B. C., "Optical waveguide combiners for AR headsets: features and limitations", Proc. SPIE 11062, Digital Optical Technologies 2019, 110620J (Jul. 16, 2019); https://doi.org/10.1117/12.2527680.

(Continued)

*Primary Examiner* — William B Partridge
*Assistant Examiner* — David Paul Sedorook
(74) *Attorney, Agent, or Firm* — Sughrue Mion, PLLC

(57)     ABSTRACT

A light emitting device includes a substrate, a plurality of light emitting diodes located over the substrate, and a plurality of micro-lenses. Each of the plurality of micro-lenses is located over a respective one of the plurality of light emitting diodes. Each of the plurality of micro-lenses has a first symmetry axis, each of the plurality of light emitting diodes has a second symmetry axis, and at least some of the plurality of micro-lenses have the first symmetry axis which is laterally displaced relative to the second symmetry axis of the respective one of the plurality of light emitting diodes.

17 Claims, 15 Drawing Sheets

(56) References Cited

U.S. PATENT DOCUMENTS

| | | | |
|---|---|---|---|
| 10,927,294 B2 | 2/2021 | Mamuye et al. | |
| 11,417,641 B2 | 8/2022 | Zhang et al. | |
| 2010/0259766 A1* | 10/2010 | Wiese | H01L 25/167 |
| | | | 219/121.72 |
| 2011/0267813 A1 | 11/2011 | Kubota | |
| 2017/0069611 A1 | 3/2017 | Zhang et al. | |
| 2017/0250322 A1 | 8/2017 | Wang et al. | |
| 2018/0307036 A1 | 10/2018 | Iba | |
| 2021/0013453 A1* | 1/2021 | Matsuda | H10K 59/879 |
| 2021/0159373 A1* | 5/2021 | Grundmann | H01L 24/80 |
| 2021/0193949 A1 | 6/2021 | Huang et al. | |
| 2022/0115629 A1* | 4/2022 | Suzuki | G02B 19/0014 |

OTHER PUBLICATIONS

Murata, T. et al., "Input couplers for thin light-guides and light-emitting diodes," Optical Engineering 47(2), 027001 (Feb. 1, 2008). https://doi.org/10.1117/1.2838592.

Sarayeddline, K. et al., "Monolithic light guide optics enabling new user experience for see-through AR glasses", Proc. SPIE 9202, Photonics Applications for Aviation, Aerospace, Commercial, and Harsh Environments V, 92020E (Sep. 5, 2014); https://doi.org/10.1117/12.2064172.

https://www.slideshare.net/AugmentedWorldExpo/khaled-sarayeddine-optinvent-ar-displays-technology-overview?from_action=save (viewed on Nov. 22, 2022).

Zhang, L. et al., "Wafer-scale monolithic hybrid integration of Si-based IC and III-V epi-layers—A mass manufacturable approach for active matrix micro-LED micro-displays," Society for Information Display, vol. 26, No. 3, pp. 137-145, (Mar. 2018); https://doi.org/10.1002/jsid.649.

ISR—Notification of Transmittal of The International Search Report and Written Opinion of the International Searching Authority for International Patent Application No. PCT/US2022/050723, mailed Apr. 3, 2023, 10 pages.

* cited by examiner

100d

100c

LIGHT EMITTING DEVICE WITH IMPROVED RADIATION DISTRIBUTION AND METHOD OF MAKING THEREOF

FIELD

This disclosure relates to light emitting devices, and particularly to light emitting diodes having micro-lenses that generate narrow angular radiation distributions and methods of fabricating the same.

BACKGROUND

Light emitting devices are used in electronic displays, such as backlights in liquid crystal displays in laptop computers and televisions. Light emitting devices include light emitting diodes (LEDs) and various other types of electronic devices configured to emit light.

For light emitting devices, such as LEDs, the emission wavelength is determined by the band gap of the active region of the LED together with size dependent quantum confinement effects. Often the active region includes one or more bulk semiconductor layers or quantum wells (QW). For III-nitride based LED devices, such as GaN based devices, the active region (e.g., bulk semiconductor layer or QW layer) material may be ternary, having a composition such as $In_xGa_{1-x}N$, where $0<x<1$.

The band gap of such III-nitride materials is dependent on the amount of In incorporated in the active region. Higher indium incorporation yields a smaller band gap and thus longer wavelength of the emitted light. As used herein, the term "wavelength" refers to the peak emission wavelength of the LED. It should be understood that a typical emission spectra of a semiconductor LED is a narrow band of wavelengths centered around the peak wavelength.

SUMMARY

An embodiment light emitting device includes a substrate, a plurality of light emitting diodes located over the substrate, and a plurality of micro-lenses. Each of the plurality of micro-lenses is located over a respective one of the plurality of light emitting diodes. Each of the plurality of micro-lenses has a first symmetry axis, each of the plurality of light emitting diodes has a second symmetry axis, and at least some of the plurality of micro-lenses have the first symmetry axis which is laterally displaced relative to the second symmetry axis of the respective one of the plurality of light emitting diodes.

DETAILED DESCRIPTION

Figures 1A, 1B:
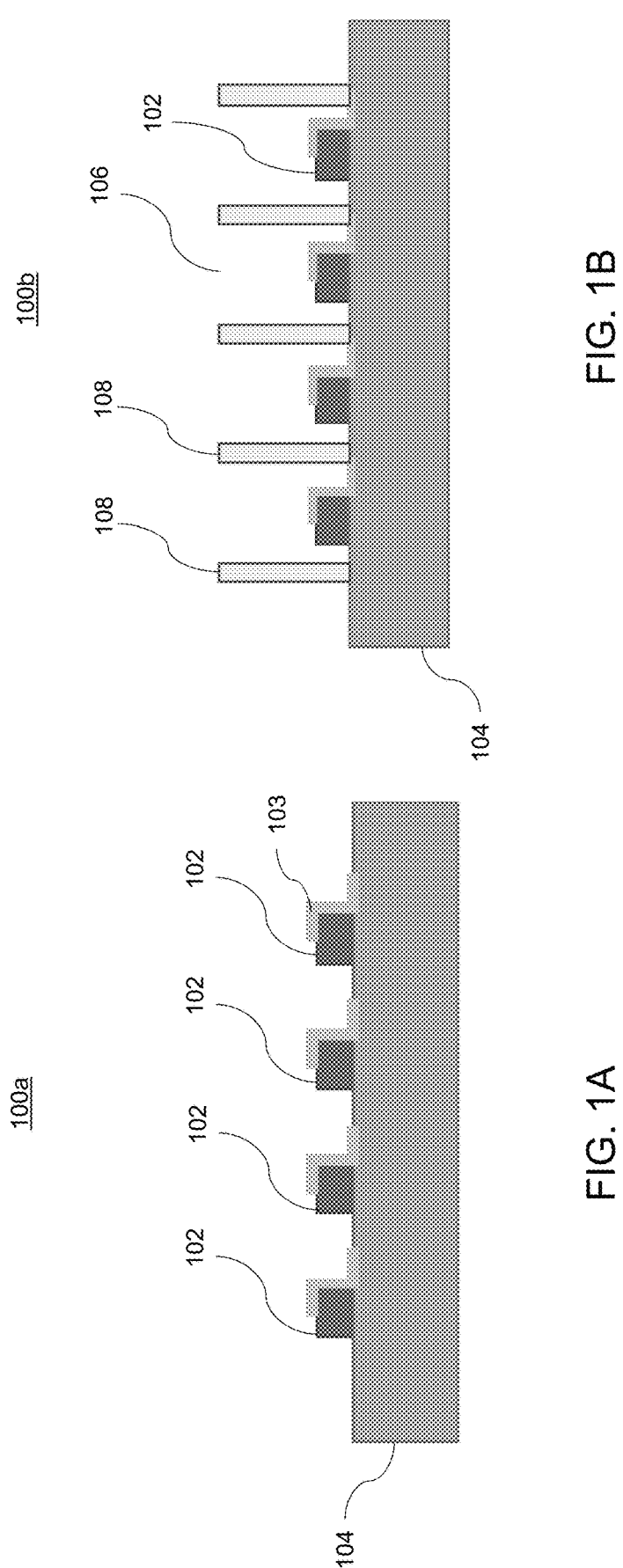
FIG. 1A is a vertical cross-sectional view of an intermediate structure that may be used in the formation of an array of light emitting devices, according to various embodiments.
FIG. 1B is a vertical cross-sectional view of a further intermediate structure that may be used in the formation of an array of light emitting devices, according to various embodiments.

A display device, such as a direct view display may be formed from an ordered array of pixels. Each pixel may include a set of subpixels that emit light at a respective peak wavelength. For example, a pixel may include a red subpixel, a green subpixel, and a blue subpixel. Each subpixel may include one or more light emitting diodes that emit light of a particular wavelength. A traditional arrangement is to have red, green, and blue (RGB) subpixels within each pixel. Each pixel may be driven by a backplane circuit such that any combination of colors within a color gamut may be shown on the display for each pixel. The display panel may be formed by a process in which LED subpixels are soldered to, or otherwise electrically attached to, a bond pad located on a backplane. The bond pad may be electrically driven by the backplane circuit and other driving electronics.

Various embodiments provide a light emitting device configured to create high efficiency red, green, blue, and/or other color pixelated light from a shorter wavelength excitation source using photonically pumped quantum dots in a vertical cavity structure. Embodiment micron-scale light emitting diodes (micro-LEDs), which have a length and width less than 100 microns, such as 5 to 20 microns, may be used in display devices. This emerging technology offers ultimate black levels by using individual LEDs at each pixel location of a display device. Further, each pixel may be configured to generate a single color of light. A backplane upon which individual LEDs may be attached may include a substrate (e.g., plastic, glass, semiconductor, etc.) with thin-film transistor (TFT) structures, silicon CMOS, or other driver circuitry that may be configured to apply a voltage or current to each LED independently. For example, the backplane may include TFTs on a glass or plastic substrate, or bulk silicon transistors (e.g., transistors in a CMOS configuration) on a bulk silicon substrate or on a silicon-on-insulator (SOI) substrate. While micro-LEDs are described in the embodiments below, it should be noted that other types of LEDs (e.g., nanowire or other nanostructure LEDs) or macro-LEDs having a size (e.g., width and length) greater than 100 microns may also be used instead of or in addition to the micro-LEDs.

In some embodiments, a size of each micro-LED may be smaller than a pitch of the pixels used in a particular display device, such as a direct view display device or another display device. For example, a 300 ppi display may have pixels having a pitch of approximately 85 microns, while a typical micro-LED for such a display may have a width that is approximately 20 microns. Micro-LEDs that include an indium-doped GaN material (i.e., LEDs that emit a color that depends on indium doping of GaN) may suffer degradation of efficiency and uniformity with decreasing LED size (e.g., sizes less than 10 microns) due to difficulties associated with indium doping of GaN crystal structures. Thus, longer peak wavelength emitting III-nitride micro-LEDs (e.g., red LEDs) which utilize a higher indium content in their active regions may have insufficient efficiency and uniformity due to the degraded indium doping.

Some embodiments of the instant disclosure may include a photonic emitter based on a LED having an undoped GaN active region (e.g., a micro-LED having a GaN light emitting active layer) or a low indium doped InGaN active region (e.g., a micro-LED having a low indium content InGaN light emitting active layer) coupled with a photonically pumped color conversion material. Such LEDs may be ultraviolet (UV) radiation or blue light emitting micro-LEDs having a peak emission wavelength in the UV radiation or blue light spectral region (e.g., 370 to 460 nm, such as 390 to 420 nm, for example 400 to 410 nm). As used herein, the blue light spectral region includes blue and violet colors as perceived by the human observer.

In one embodiment, the color conversion material may include quantum dots. The quantum dots may be configured to absorb photons generated by the GaN emitter and to generate various colors of light depending on the properties of the quantum dots (e.g., quantum dot size and material composition). Such structures avoid problems associated with indium doping of small GaN structures.

In the size regime (i.e., sizes less than 10 microns) appropriate for augmented reality (AR) displays (e.g., smart glasses) and other applications, the use of an undoped GaN or low indium doped GaN LED active region and photonically pumped quantum dots to create various colors, may provide display devices having better uniformity across an array of micro-LEDs. Such arrays may also exhibit higher efficiency than systems having colored LEDs based on relatively high indium doped GaN (e.g., red LEDs containing a higher amount of indium than blue LEDs). The increased efficiency and uniformity may be achieved because quantum dots may be manufactured with a high degree of uniformity of size and material composition. Such uniform quantum dots have corresponding uniform (i.e., narrow linewidth) emission properties.

Extraction of light emitted by micro-LEDs may be increasingly challenging with decreasing pixel pitch and micro-LED size. Disclosed embodiments provide improved optical extraction of photons (e.g., along a specific direction) generated by the quantum dots, while maintaining high efficiency by avoiding loss of photons to absorbing surfaces. Disclosed systems may also prevent or reduce pump photons from escaping the device, thereby ensuring purity of the color emitted by a given micro-LED. This may be accomplished by forming optical cavity walls that are reflective, including a light extracting material layer, and including other light extracting structures, such as micro-lenses, a distributed Bragg reflector (DBR), etc.

FIG. 1A is a vertical cross-sectional view of an intermediate structure 100a that may be used in the formation of an array of light emitting devices, according to various embodiments. The intermediate structure 100a may include a plurality of micro-LEDs 102 formed on a substrate 104. As described above, the micro-LEDs 102 may have a peak emission wavelength in the UV radiation or blue light spectral region (e.g., UV or blue emitting micro-LEDs, also referred to as UV or blue LEDs). Such LEDs may include undoped GaN active regions that are configured to emit ultraviolet (UV) photons and/or blue spectral range photons.

In one embodiment, the micro-LEDs 102 may have at least one electrode 103 located on the top of the LED and facing away from the substrate 104. The electrode 103 may include an anode or a cathode electrode. In one embodiment, the micro-LEDs 102 may include vertical LEDs in which the second electrode (not shown for clarity) is located between the substrate 104 and the bottom of the micro-LED 102. In another embodiment, the micro-LEDs may include lateral LEDs in which both electrodes are located on the same side of the LED (e.g., on top or on bottom sides of the LED).

The substrate 104 may be a backplane having electrical circuitry (e.g., TFT and/or CMOS circuits) configured to supply voltages and currents to the micro-LEDs 102 via the electrodes (including the electrodes 103) to thereby control light emission by the micro-LEDs 102. A backplane may be an active or passive matrix backplane substrate for driving LEDs. As used herein, a "backplane substrate" refers to any substrate configured to affix multiple devices thereupon. In one embodiment, the backplane may include a substrate including silicon, glass, plastic, and/or at least other material that may provide structural support to devices attached thereto. In one embodiment, the backplane substrate may be a passive backplane substrate, in which metal interconnect structures (not shown) including metallization lines are present, for example, in a crisscross grid and dedicated active devices (e.g., TFTs) for each LED are not present. In another embodiment, the backplane substrate may be an active backplane substrate, which includes metal interconnect structures as a crisscross grid of conductive lines and further includes dedicated active devices (e.g., CMOS transistors or TFTs) for each LED at one or more intersections of the crisscross grid of conductive lines.

FIG. 1B is a vertical cross-sectional view of a further intermediate structure 100b that may be used in the formation of an array of light emitting devices, according to various embodiments. Intermediate structure 100b may include a plurality of optical cavities 106 formed over the micro-LEDs 102. Each optical cavity 106 may be bounded by cavity walls 108. The optical cavities 106 may be constructed using a reflective material which has suitable mechanical properties to form high aspect ratio cavities (e.g., 5 microns or less, such as 1-2 microns, in diameter, and 10 microns or more, such as 20-30 microns, in height) with relatively thin cavity walls 108. The cavity walls 108 may have a thickness of less than 10 microns, such as 0.5-5 microns, including 1-2 microns. The cavity walls 108 may form an insulating matrix.

Figures 2A, 2B:
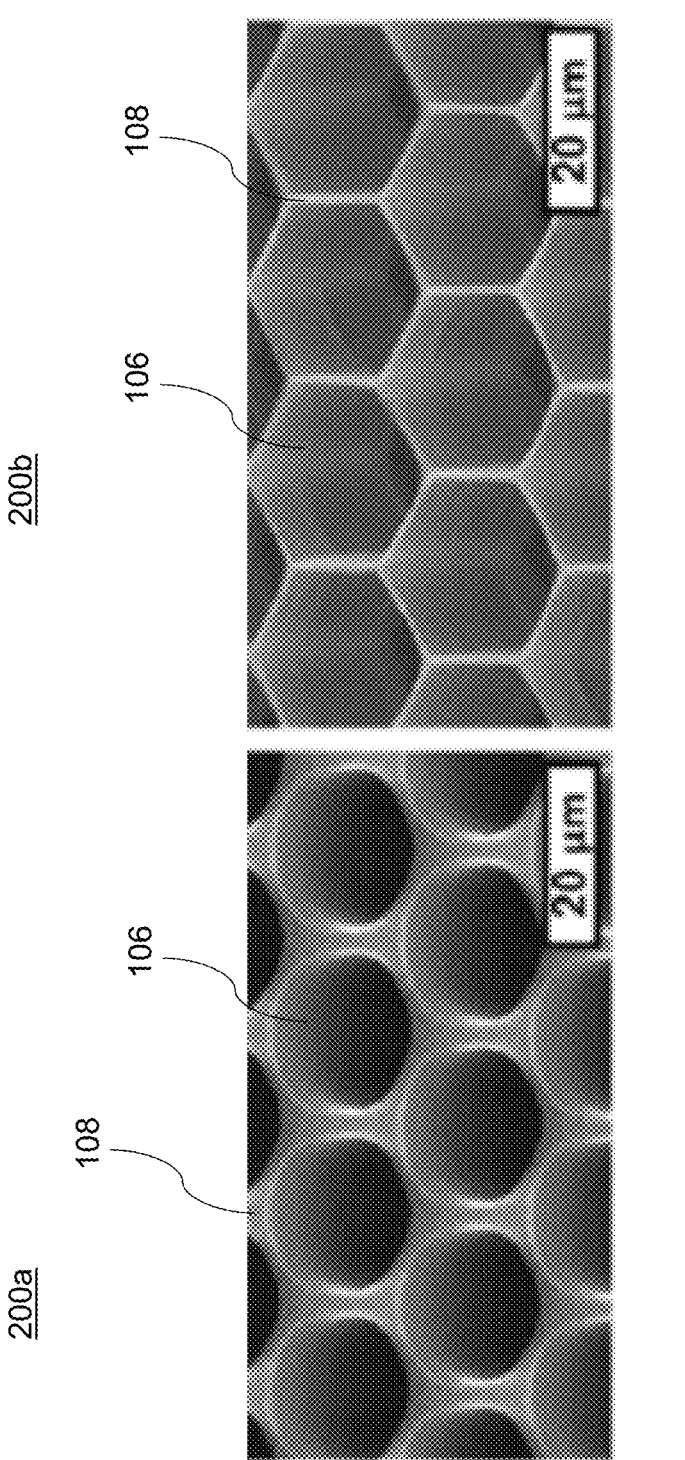
FIG. 2A is a top perspective view of a first patterned matrix having a plurality of vias formed therein, according to various embodiments.
FIG. 2B is a top perspective view of a second patterned matrix having a plurality of vias formed therein, according to various embodiments.

The matrix material may be chosen to be compatible with both thermal evaporative processing steps and solvent based fluidic depositions and evaporation. One such matrix material is alumina, although silica, titania, or other insulating metal oxide materials may be used. Various materials that are typically used to fabricate micro-electromechanical (MEMS) devices may be used to form the optical cavities 106 bounded by cavity walls 108 made of an electrically insulating material (e.g., alumina). Such materials have a relatively high index of refraction and are suitable for forming structures having high aspect ratios. A layer of such matrix material (not shown in FIG. 1B) may be grown or deposited on the micro-LED 102 array located on the substrate 104 and techniques such as etching and other micro machining approaches may be used to generate optical cavities 106 in the material. FIG. 2A is a top perspective view of a matrix 200a having a plurality of cylindrical optical cavities 106 bounded by cavity walls 108. FIG. 2B is a top perspective view of a matrix 200b having a plurality of hexagonal optical cavities 106 bounded by cavity walls 108.

In one embodiment, a voltage may be applied to an anode or cathode electrode 103 of the micro-LEDs 102 to thereby form one side of an etch bias. For example, if the matrix 200a or 200b (i.e., the cavity walls 108) include alumina, then the porous alumina may be formed by anodic oxidation. In this embodiment, an aluminum metal layer may be deposited over the micro-LEDs 102, and then electrochemically anodized to form a porous anodic alumina matrix with optical cavities (i.e., pores) 106 bounded by anodic alumina cavity walls 108. The substrate 104 containing the aluminum layer may be placed in an acid electrolyte (e.g., oxalic acid, chromic acid, sulfuric acid and/or phosphoric acid), and a voltage may be applied to the electrodes 103 of the micro-LEDs 102 and/or to an external electrode to form the porous anodic alumina matrix containing the optical cavities (i.e., pores) 106 bounded by the alumina cavity walls 108. The optical cavities 106 may be arranged in a hexagonal array in an anodic alumina matrix.

Figure 1D:
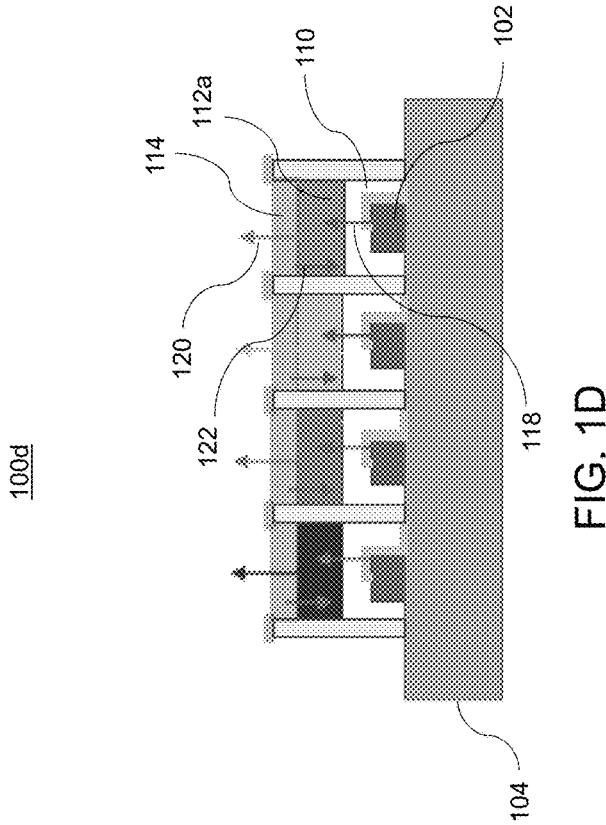
FIG. 1D is a vertical cross-sectional view of an array of light emitting devices, according to various embodiments.
Figure 1C:
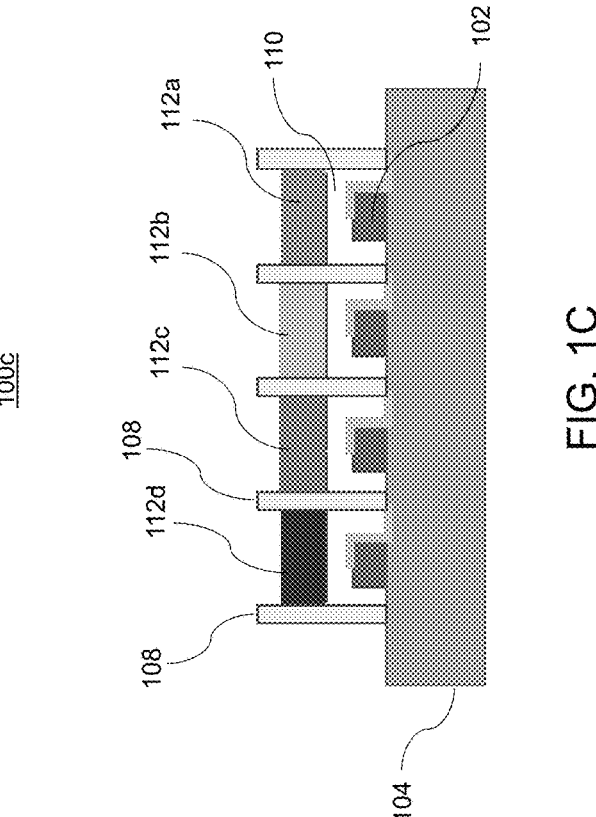
FIG. 1C is a vertical cross-sectional view of a further intermediate structure that may be used in the formation of an array of light emitting devices, according to various embodiments.

FIG. 1C is a vertical cross-sectional view of a further intermediate structure 100c that may be used in the formation of an array of light emitting devices, according to various embodiments. Intermediate structure 100c may include a light extracting material layer 110 and a color conversion material (112a, 112b, 112c, 112d) formed in the optical cavities 106 over the array of micro-LEDs 102. The light extracting material layer 110 may have an index of refraction that is lower than an index of refraction of the material forming the cavity walls 108. For example, the light extracting material layer 110 may have an index of refraction of less than 1.7, such as 1.3 to 1.5 for alumina cavity walls 108. The lower refractive index of the light extracting material layer 110 may cause pump photons (i.e., photons generated by the micro-LEDs 102) to be reflected from cavity walls 108 rather than being absorbed by or transmitted through that cavity walls 108. Such reflection prevents loss of photons and thereby acts to increase the quantum efficiency of the device.

Various polymer materials may be used as a light extracting material layer 110. One such polymer is Jet-144 (i.e., an inkjet compatible polymer), which has an index of refraction of 1.44 and which may be deposited into the optical cavities 106 using an inkjet system. A thickness of the cavity walls 108 may be configured to be as thick as possible to increase a probability that photons that do not reflect from the cavity walls 108 are absorbed (i.e., extinguished) so that they do no penetrate into an adjacent cavity.

The light extracting material layer 110 may be deposited using various techniques including ink jet, vacuum, pressure, and/or gravitational deposition. After deposition, the polymer may be cross-linked, for example, by exposure to ultra-violet (UV) radiation. In other embodiments, a solvent in which the polymer is dissolved may be drawn out by evaporation leaving a residual cross-linked polymer as the light extracting material layer 110 in each cavity. In various embodiments, the light extracting material layer 110 may be formed with various thicknesses and may or may not contain additional light scattering materials, such as ZrO2, $TiO_2$ or $SiO_2$ nano or micro beads, textured or corrugated interface, etc., as described in greater detail below. The light extracting material layer 110 may partially fill the optical cavities 106 such that empty cavity space may remain over the top of the light extracting material layer 110 in each cavity.

The color conversion material (112a, 112b, 112c, 112d) may then be formed in the optical cavities 106 (e.g., see FIG. 1B) over the light extracting material layer 110 (e.g., see FIG. 1C). The color conversion material (112a, 112b, 112c, 112d) may include quantum dots corresponding to various different colors. In this example, the color conversion material (112a, 112b, 112c, 112d) may include a plurality of first quantum dots 112a, a plurality of second quantum dots 112b, a plurality of third quantum dots 112c, and a plurality of fourth quantum dots 112*d*, which are configured to convert UV pump photons into photons having first, second, third, and fourth colors, respectively. The second and third colors may include different peak wavelengths in the green color spectrum range. Alternatively, only three quantum dot colors may be used.

The quantum dots may each be formed as a nanocrystal having a 1 to 10 nm diameter, such as 2 to 8 nm nanocrystals of a compound semiconductor material, such as a Group III-V semiconductor material (e.g., indium phosphide, as described in U.S. Pat. No. 9,884,763 B1, incorporated herein by reference in its entirety), a Group II-VI semiconductor material (e.g., ZnSe, ZnS, ZnTe, CdS, CdSe, etc., core-shell quantum dots, as described in U.S Patent Application Publication US 2017/0250322 A1, incorporated herein by reference in its entirety), and/or Group semiconductor material (e.g., AgInGaS/AgGaS core-shell quantum dots, as described in U.S. Pat. No. 10,927,294 B2, incorporated herein by reference in its entirety). The quantum dots may emit different color light (e.g., reg, green or blue) depending on their diameter. The larger dots emit longer wavelength light while the smaller dots emit shorter wavelength light. The quantum dots may be suspended in a material (e.g., a polymer such as polyimide) having a different (e.g., higher) index of refraction from that of the light extracting material layer 110. For example, the polyimide material may be a refractive index of 1.6 to 1.75, such as about 1.7.

Quantum dots corresponding to various colors may be selectively deposited in respective cavities. For example, first cavities may be formed by etching first vias in a matrix material. First quantum dots corresponding to first color may then be introduced into the first cavities and a layer of protective material may then be formed over the first quantum dots. The process may then be repeated to form second cavities, third cavities, etc., and to respectively introduce second quantum dots, third quantum dots, etc. into the respective cavities.

In other embodiments, a photoresist may be deposited over all cavities except a plurality of first cavities. A first layer of quantum dots configured to generate a first color (e.g., red) may then be deposed into the plurality of first cavities corresponding to subpixels having the first color. A polymer in which the first quantum dots are suspended may then be cross linked by evaporation or by exposure to UV light. The process may then be repeated for the other optical cavities to respectively deposit quantum dots configured to generate other color light (e.g., green and blue).

An optional organic planarization layer may be formed over the color conversion material. The color conversion material and the optional organic planarization layer may partially fill the optical cavities 106.

FIG. 1D is a vertical cross-sectional view of an array 100*d* of light emitting devices, according to various embodiments. As shown, the array 100*d* may include a color selector 114 formed in and/or over the optical cavities 106. The color selector 114 may include a color filter array and/or a distributed Bragg reflector. In one embodiment, the color selector 114 may be formed in the optical cavities and may extend to the top of the cavity walls 108 such that the optical cavities 106 are completely filled with the above materials.

The color conversion material (112*a*, 112*b*, 112*c*, 112*d*) may be configured to absorb the pump photons 118 and to convert them to emitted converted photons (e.g., visible light, such as red, green or blue light) 120. In some embodiments, the color conversion material (112*a*, 112*b*, 112*c*, 112*d*) may not be sufficiently thick and/or dense to fully convert all pump photons 118 into converted photons 120. Thus, the color selector 114 formed over the color conversion material (112*a*, 112*b*, 112*c*, 112*d*) absorbs and/or reflects all or a portion of the pump photons 118 that are not converted by the color conversion material (112*a*, 112*b*, 112*c*, 112*d*), without absorbing and/or reflecting the converted photon 120 emitted by the color conversion material.

Each of the micro-LEDs 102 may be configured to emit pump photons 118 having a common wavelength or within a range of the target wavelengths. For example, GaN-based micro-LEDs 102 may emit pump photons 118 having a wavelength that is 400 to 410 nm, such as approximately 405 nm (i.e., in the blue or near-UV part of the electromagnetic spectrum). The micro-LEDs 102 may exhibit a high degree of uniformity and may exhibit high efficiency. However, slight variations in the wavelength of such micro-LEDs 102 may not be easily visible to the eye. Further, any leakage of pump photons 118 through the color conversion material (112*a*, 112*b*, 112*c*, 112*d*) may cause minimal degradation of the color purity of converted photons 120.

In one embodiment, the color selector 114 includes a color filter array may include an organic dye embedded in an organic polymer. The dye may be configured to absorb UV radiation of the pump photons 118 but to not absorb blue, green, or red light of the converted photons. Optionally, a different dye may be applied over each of the colored subpixels (e.g., red, green, and blue subpixels). For example, a first dye filter material configured to primarily transmit red light may be applied to red subpixels, a second dye filter material configured to primarily transmit green light may be applied to green subpixels, and third dye filter material configured to primarily transmit blue light may be applied to blue subpixels. The color filters may by formed using a further photolithographic process. In various embodiments, a thin film encapsulation (TFE) layer or layer stack may then be applied over the color filter materials to provide protection against air or moisture ingress into the quantum dot layers of the color conversion material. In one embodiment, the TFE may include a tri-layer stack of two silicon nitride layers separated by a polymer layer.

In an alternative embodiment, the color selector 114 may include a DBR formed over the color conversion material (112*a*, 112*b*, 112*c*, 112*d*). The DBR may be configured to reflect pump photons 118, which are transmitted through the color conversion material, back into the optical cavity 106 as reflected photons 122 (e.g., UV or deep blue photons) and to allow the converted photons 120 to be transmitted out of the optical cavity 106. The DBR may be formed as an alternating multi-layer stack of materials (not shown) having different indices of refraction. For example, the DBR may be formed as a stack of N layers alternating between $TiO_2$ (n=2.5) and $SiO_2$ (n=1.5) with N being 2 or more. In other embodiments, various other materials having respective indices of refraction may be used in constructing the DBR.

Embodiments in which the DBR includes $TiO_2$ and $SiO_2$ with N=2 may have a bandwidth of 164 nm at a center wavelength of 405 nm and a maximum reflectivity R of 84%. Embodiments in which the DBR stack includes a larger number of layers (i.e., N>2) may have increased reflectivity. As such, the probability of a UV pump photon 118 passing through the DBR may be decreased. The UV photons 122 reflected from the DBR back into the optical cavity 106 may circulate through the color conversion material (112*a*, 112*b*, 112*c*, 112*d*) and may thereby have an increased probability of also being converted to converted photons 120 having the target wavelength (e.g., green, blue, or red). In this way, any UV reflected photons 122 that are not initially absorbed by the color conversion material (112a, 112b, 112c, 112d) may eventually be absorbed and converted to converted photons 120 having the target emission wavelength. This process, which is sometimes called "photon recycling" may increase the quantum efficiency of the device.

If the micro-LEDs 102 include shorter wavelength blue light emitting LEDs, then the DRB 114 may block the shorter wavelength blue light (i.e., pump photons 118) of the micro-LEDs 102 but transmit the longer wavelength converted photons 120 emitted from blue quantum dots of the color conversion material. Alternatively, the DBR 114 may be omitted over the blue light emitting subpixels.

The DBR may be formed by a deposition (e.g., by evaporation) of a multi-layer stack (not shown) over all of the subpixels. As such, the DBR may provide additional protection against moisture and oxygen ingress into the quantum dot layer. A higher value of N may further increase both the DBR reflectivity and the protection from moisture and oxygen, leading to improved overall system performance and durability.

In various additional embodiments, other materials may be used for the various components of the device. For example, the DBR may include a wide range of materials each having respective refractive indices, for example, nitrides (TiN, AlN, TiN, etc.), polysilicon, etc. Some embodiments may include multiple layers of quantum dots, multiple DBR structures, etc. The light extracting material layer 110, described above, may be omitted in some embodiments or multiple light extraction material layers 110 may be used. By using a more effective DBR 114, the layer thickness and density of the color conversion material (112a, 112b, 112c, 112d) may be reduced. In further embodiments, the optical cavities 106 may be formed in various ways. For example, the optical cavities 106 may be formed in a separate matrix layer which may then be attached to the array of micro-LEDs 102 after the optical cavities 106 are formed. Further embodiments may also include light-collimating elements to mitigate performance degradation that may otherwise occur due to lateral photon propagation.

Figure 1E:
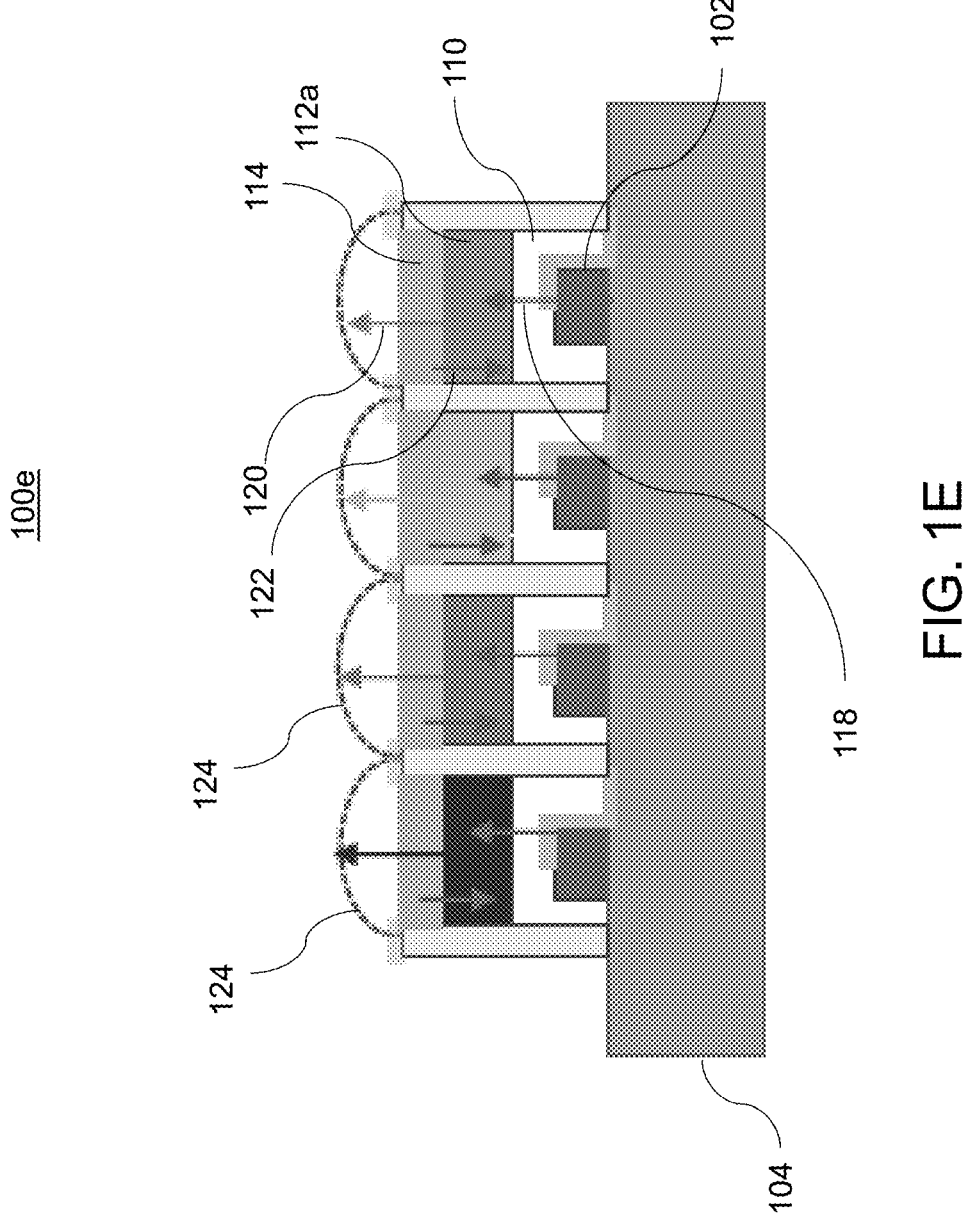
FIG. 1E is a vertical cross-sectional view of a further array of light emitting devices, according to various embodiments.

FIG. 1E is a vertical cross-sectional view of a further array 100e of light emitting devices, according to various embodiments. As shown, the array 100e of light emitting devices includes micro-lenses 124 formed over optical cavity 106. Each micro-lens 124 may help to improve light extraction from each micro-LED structure and may thereby improve efficiency of the array 100e. In general, extraction of light emitted by micro-LEDs may be increasingly challenging with decreasing pixel pitch and micro-LED size. In this regard, the color conversion material (112a, 112b, 112c, 112d) may be chosen to be sufficiently thick to convert all of the pump photons 118 into converted photons 120, each having a specific color. The thickness of the color conversion material (112a, 112b, 112c, 112d) may be very large compared to a lateral dimension of the subpixel. In such a structure, photons may move diffusively rather than ballistically out of the micro-LED subpixel. Such diffusively moving photons may spread to adjacent subpixels, potentially causing optical cross talk.

Disclosed embodiments provide improved optical extraction of photons (e.g., along a specific direction) generated by the quantum dots, while maintaining high efficiency by avoiding loss of photons to absorbing surfaces. As described above, this may be accomplished by forming a matrix structure that include cavity walls 108 that are reflective, including a light extracting material layer 110, and/or including a color selector 114, such as a DBR.

The use of quantum dots as a color conversion material (112a, 112b, 112c, 112d) for micro-LED displays may include deposition and patterning of dense quantum dot layers at very small feature sizes. To achieve sufficient absorption of pump photons 118 (e.g., see FIGS. 1D and 1E) in the quantum dot layer, subpixels with aspect ratios of greater than 1:1 may be used. Such subpixels may also be separated by cavity walls 108 formed of an opaque matrix material to prevent color crosstalk (i.e., photons from one micro-LED propagating into neighboring subpixels) in the display.

Various embodiments include a matrix, such as a matrix 200a or 200b (e.g., see FIGS. 2A and 2B), which may allow better light extraction from each subpixel and may mitigate photonic color crosstalk. Using the matrix as a template and sequentially opening vias corresponding to different color subpixels allows the deposition and curing of quantum dot inks without relying on a high-resolution photo-patternable resin formulation. Other embodiments may use other techniques to fabricate LED structures.

Figure 3:
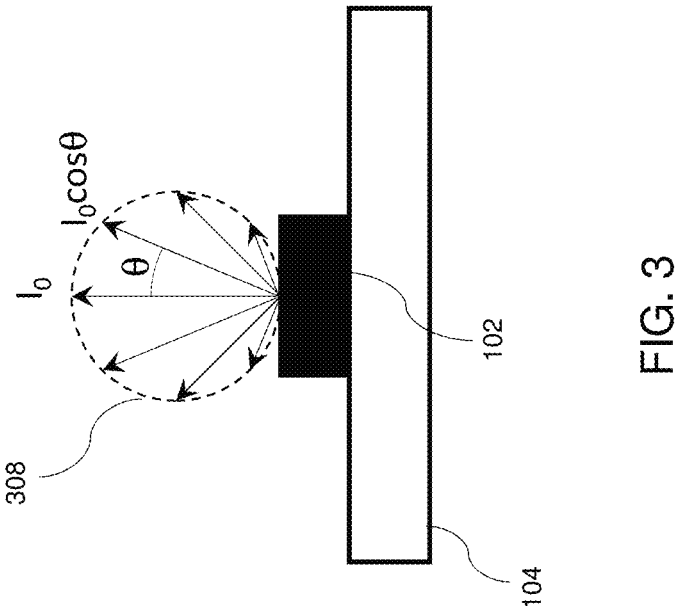
FIG. 3 is a vertical cross-sectional view of a micro-LED that emits a Lambertian radiation pattern, according to various embodiments.

FIG. 3 is a vertical cross-sectional view of an intermediate structure 300 illustrating a radiation pattern of a micro-LED 102 formed on a substrate 104, according to various embodiments. The micro-LED 102 may be configured to emit a Lambertian radiation pattern. In this regard, the intensity (i.e., number of photons per unit time per unit area) of radiation emitted varies as the cosine of the emission angle relative to the direction perpendicular to an emitting surface. The various arrows in FIG. 3 each have a length that is proportional to the intensity of emitted radiation in the direction of the arrow. For example, radiation emitted at an angle $\theta$ may have an intensity given by $I = I_0 \cos(\theta)$, where $I_0$ is the intensity that is emitted perpendicular to the surface. The circle 308 shows the continuous angular cosine dependence of the emitted radiation from the top surface of the micro-LED 102. As shown, the emitted intensity is greatest in the direction perpendicular to the top surface and decreases away from the direction perpendicular to the surface, and is zero parallel to the surface (i.e., zero emission from the top surface parallel to the top surface).

Figures 4, 5:
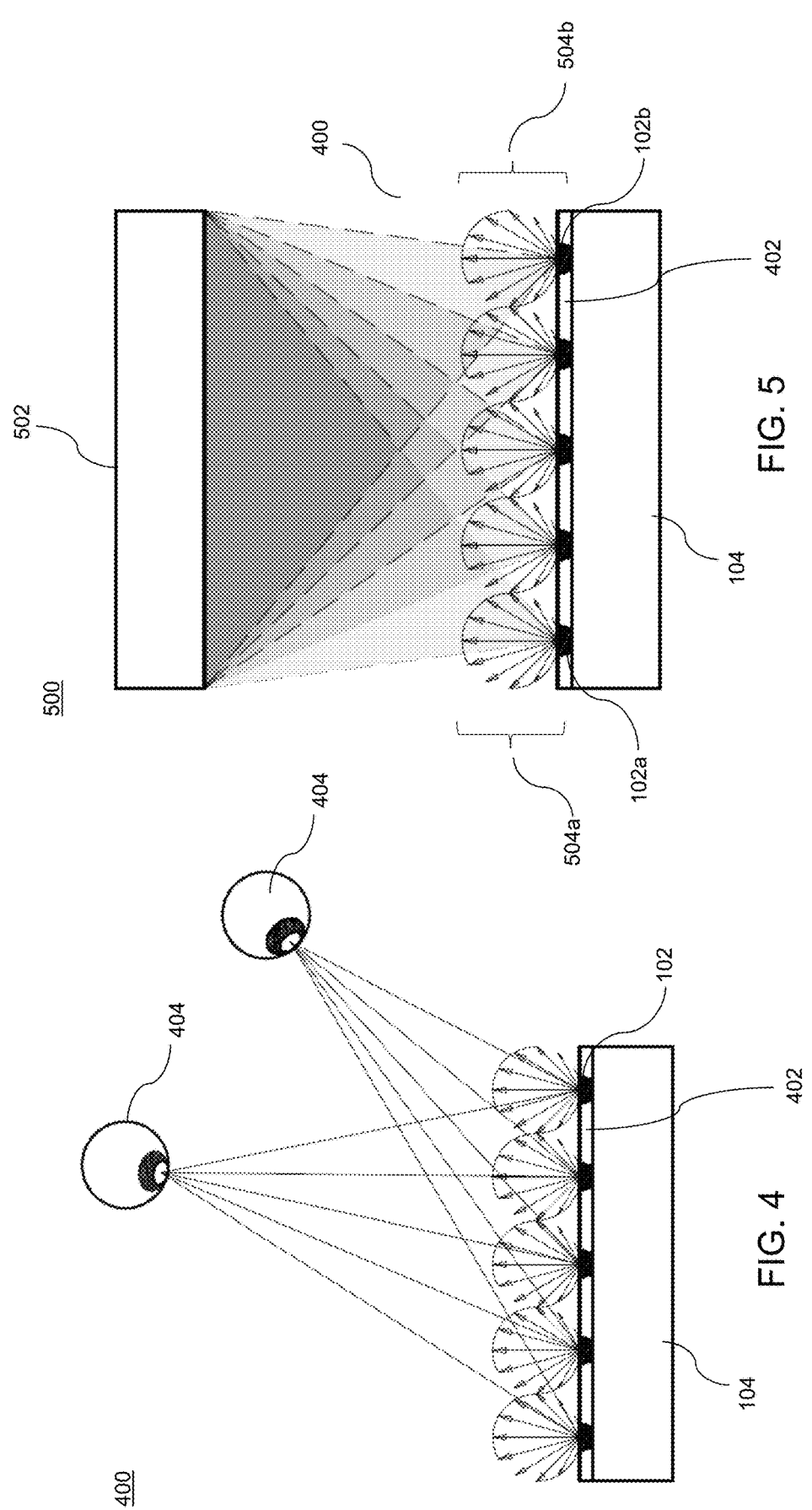
FIG. 4 is a vertical cross-sectional view of a light emitting device that is configured to generate a Lambertian radiation pattern, according to various embodiments.
FIG. 5 is a vertical cross-sectional view of a system in which a light emitting device having a Lambertian radiation pattern is coupled to an optical system, according to various embodiments.

FIG. 4 is a vertical cross sectional view of a light emitting device 400 having a Lambertian radiation pattern, according to various embodiments. The light emitting device 400 may include a plurality of light emitting diodes 102 (e.g., micro-LEDs) formed as a two-dimensional array on a substrate 104. The light emitting diodes 102 may be formed within an encapsulation layer 402 that is formed over a top surface of the substrate 104. The encapsulation layer 402 may comprise the above described cavity walls 108 that form an insulating matrix and/or the above described light extracting material layer 110. Alternatively, the encapsulation layer 402 may comprise a polymer encapsulant which encapsulates at least the sidewalls of the light emitting diodes 102. Each of the light emitting diodes 102 may be configured to generate light of a specific wavelength. For example, the light emitting diodes 102 may be configured as an ordered array of pixels with each pixel including a red subpixel, a blue subpixel, and a green subpixel. In alternative embodiments, the light emitting diodes 102 may be formed within an optical cavity 106 (e.g., see FIG. 1B) with a color conversion material (112a, 112b, 112c, 112d) that is configured to absorb blue or UV pump photons 118 generated by the light emitting diodes 102 and to convert the absorbed photons to converted photons (e.g., visible light, such as red, green or blue light) 120 having a longer peak wavelength than a peak wavelength of the pump photons, as described above with reference to FIGS. 1A to 1E.

In the example of FIG. 4, each light emitting diode 102 generates a radiation pattern having a Lambertian distribution, as described above with reference to FIG. 3. As such, the combined radiation pattern generated by the plurality of light emitting diodes 102 may also have a Lambertian distribution. Such a radiation distribution may be advantageous for a display device such as a television or computer screen, in which an image generated by the light emitting device 400 may be seen by a human eye 404 when viewed from a broad range of angles, as shown. Such a Lambertian distribution pattern, however, may not be advantageous when the light emitting device is used to couple the generated image to an optical system, as described in greater detail below.

FIG. 5 is a vertical cross-sectional view of a system 500 in which a light emitting device 400 is coupled to an optical system 502, according to various embodiments. The optical system 502 may be a color conversion material (e.g., quantum dots) 112 described above, a lens, a mirror, a waveguide, a polarizer, an optical shutter and/or other optical component that is configured to receive optical signals (i.e., photons) from the light emitting device 400. In this example, the light emitting device 400 generates radiation having a Lambertian distribution. As such, the coupling efficiency between the light emitting device 400 and the optical system 502 may not be optimal. In this regard, some of the radiation generated by the light emitting device 400 may not be received by the optical system.

For example, a first light emitting diode 102a may generate a first portion 504a of radiation that is emitted both toward and to the left of the optical system 502 and is therefore not received by the optical system 502. Similarly, a second light emitting diode 102b may generate a second portion 504b of radiation that is emitted toward and to the right of the optical system 502 and is therefore not received by the optical system 502. Other light emitting diodes may similarly generate a portion of radiation that is not received by the optical system 502. As such, a fraction of the radiation generated by the light emitting device 400 is not received by the optical system 502 and is therefore wasted. In further embodiments, micro-lenses may be used to reduce the amount of radiation that is lost, as described in greater detail, below.

Figure 6:
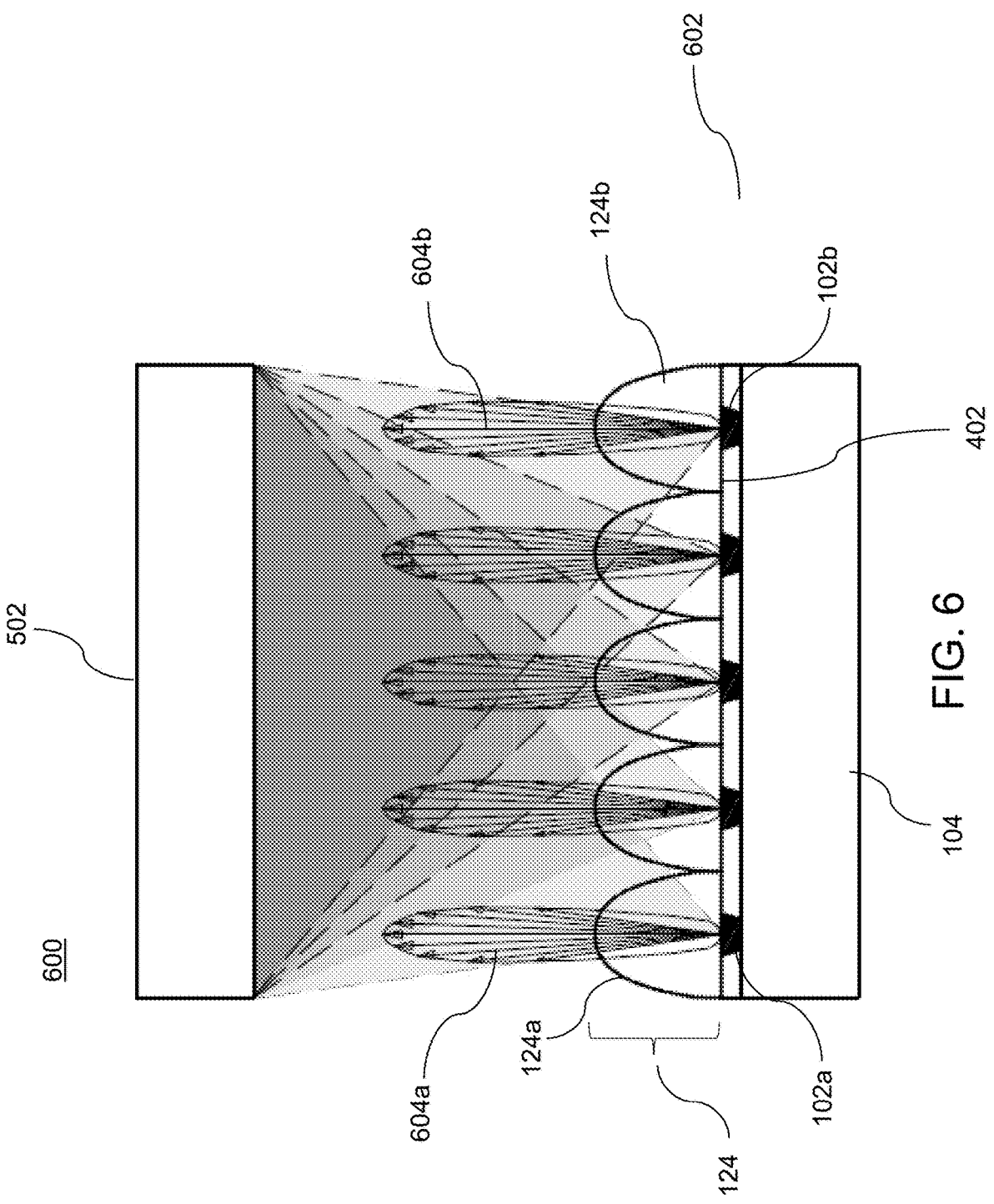
FIG. 6 is a vertical cross-sectional view of a system in which a light emitting device having a directional radiation pattern is coupled to an optical system, according to various embodiments.

FIG. 6 is a vertical cross-sectional view of a system 600 in which a light emitting device 602 having a directional radiation pattern is coupled to an optical system 502, according to various embodiments. The light emitting device 602 may be similar to the light emitting device 500 shown in FIG. 5 with the further inclusion of a plurality of micro-lenses 124 (e.g., see FIG. 1E and related description above). The micro-lenses 124 may act to shape the radiation pattern to be peaked in a predetermined direction. As used herein, a peaked pattern has a width that is narrower than the Lambertian pattern.

For example, a first micro-lens 124a may receive radiation generated by the a first light emitting diode 102a and may form the received radiation into a first radiation pattern 604a that is peaked in a upward direction, as shown in FIG. 6. Similarly, a second micro-lens 124b may receive radiation generated by the second light emitting diode 102b and may form the received radiation into a second radiation pattern 604b that is also peaked in a direction toward the optical system. As shown, the light emitting device 602 may further include a plurality of micro-lenses, each formed over a respective one of the plurality of light emitting diodes such that each of the plurality of light emitting diodes generates a peaked radiation pattern. As such, more of the radiation generated by the light emitting device 602 may be coupled into the optical system 502. In this regard, the system 600 of FIG. 6 may exhibit a higher efficiency than the system 500 of FIG. 5 because more of the photons generated by the light emitting device 602 may be received by the optical system 502.

Figures 7A, 7B:
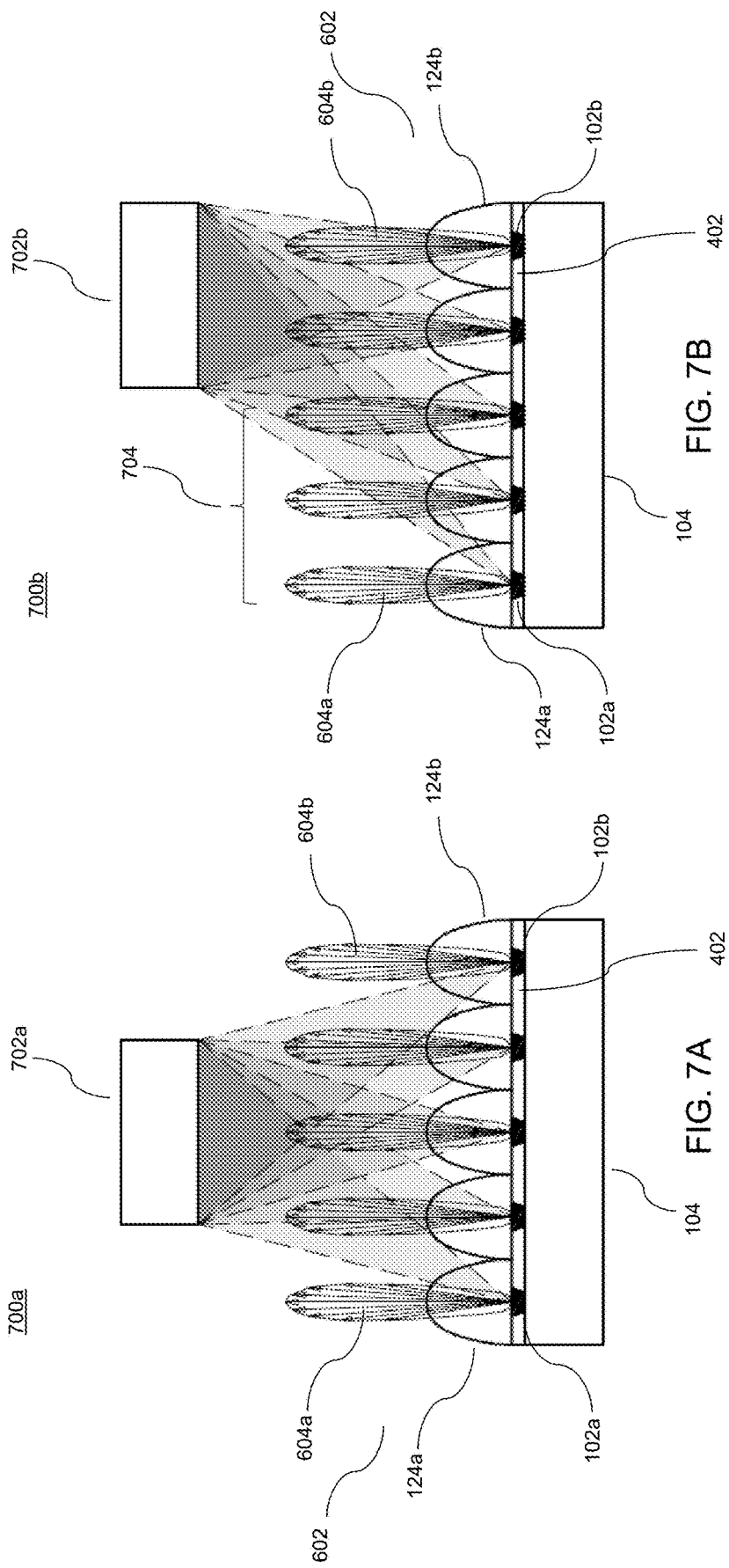
FIG. 7A is a vertical cross-sectional view of a system in which a light emitting device having a directional radiation pattern is coupled to an optical system, according to various embodiments.
FIG. 7B is a vertical cross-sectional view of a further system in which a light emitting device having a directional radiation pattern is coupled to an optical system, according to various embodiments.

FIG. 7A is a vertical cross-sectional view of a first system 700a in which a light emitting device 602 having a directional radiation pattern is coupled to a first optical system 702a with reduced efficiency, and FIG. 7B is a vertical cross-sectional view of a second system 700b in which a light emitting device 602 having a directional radiation pattern is coupled to a second optical system 702b with reduced efficiency, according to various embodiments. Each of the light emitting devices 602 may be similar to the light emitting device 602 of FIG. 6. In this regard, each of the light emitting devices in FIGS. 7A and 7B may include a first micro-lens 124a and a second micro-lens 124b that respectively generate the peaked first radiation pattern 604a and second radiation pattern 604b, as described above. In the examples of FIGS. 7A and 7B, however, the optical systems (702a, 702b) may be smaller than the optical system 502 of FIG. 5 and may not be properly aligned to receive the radiation in the first radiation pattern 604a and/or the second radiation pattern 604b. In other words, the light emitting device 602 may be wider than the optical systems (702a, 702b). The first optical system 702a may be centered over the light emitting device 602, while the second optical system 702b may be offset from the center of the light emitting device 602.

As such, a certain portion of radiation (e.g., the radiation patterns 604a or 604b) in each of the first system 700a and the second system 700b may not be efficiently coupled into the optical systems (702a, 702b) and may thus be wasted. For example, in the first system 700a of FIG. 7A, each of the first radiation pattern 604a and the second radiation pattern 604b may not be properly aligned with the optical system 702a to be received. In the second system 700b of FIG. 7B, first radiation pattern 604a may not be properly aligned with the optical system 702b to be received, while the second radiation pattern 604b may be aligned with the with the second optical system 702b and may be received by the second optical system 702b. Due to size and misalignment of the second optical system 702b, however, a fraction of radiation 704 may not be received by the second optical system 702b and may therefore be wasted. To improve coupling efficiency, therefore, various embodiments of the present disclosure may include a light emitting device that generates a radiation pattern having a size and directionality that is configured based on a size and position of a corresponding optical device, as described in greater detail below.

Figures 8A, 8B:
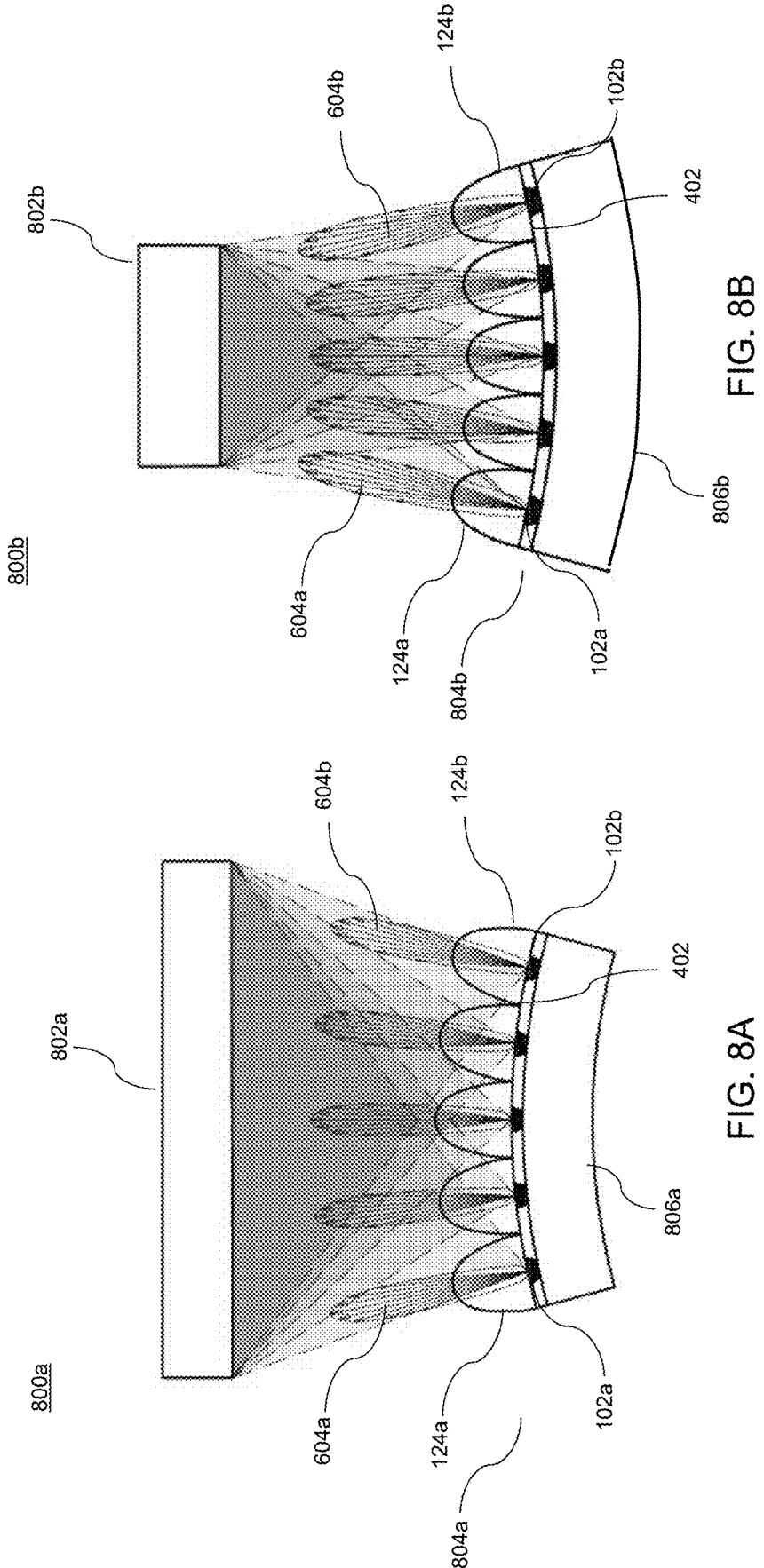
FIG. 8A is a vertical cross-sectional view of a system in which a light emitting device having a first size is coupled to an optical system having a larger second size, according to various embodiments.
FIG. 8B is a vertical cross-sectional view of a system in which a light emitting device having a first size is coupled to an optical system having a smaller second size, according to various embodiments.

FIG. 8A is a vertical cross-sectional view of a first system 800a in which a first light emitting device 804a having a first size is coupled to a first optical system 802a having a larger second size, and FIG. 8B is a vertical cross-sectional view of a second system 800b in which a second light emitting device 804b having a third size is coupled to an optical system 802b having a smaller fourth size, according to various embodiments.

The first light emitting device 804a may be formed on a first flexible substrate 806a. As shown, the first flexible substrate 806a may be configured to have a convex curvature. The curvature of the first flexible substrate 806a may cause a first radiation pattern 604a, generated by a first light emitting diode 102a, to be directed toward the optical system and to the left. Similarly, the curvature of the first flexible substrate 806a may cause a second radiation pattern 604*b*, generated by a second light emitting diode 102*b*, to be directed toward the optical system and to the right. As such, the first light emitting device 804*a* may be configured to generate a diverging radiation pattern that is enlarged relative to the first size of the first light emitting device 804*a*. In this regard, the radiation pattern generated by the first light emitting device 804*a* may be efficiently coupled to the first optical system 802*a* despite the difference in sizes of the first light emitting device 804*a* and the first optical system 802*a*.

The second light emitting device 804*b* may be formed on a second flexible substrate 806*b*. The second flexible substrate 806*b* may be configured to have a concave curvature. In the embodiment of FIG. 8B, the curvature of the second flexible substrate 806*b* may cause a first radiation pattern 604*a*, generated by a first light emitting diode 102*a*, to be directed toward the optical system and to the right. Similarly, the curvature of the second flexible substrate 806*b* may cause a second radiation pattern 604*b*, generated by a second light emitting diode 102*b*, to be directed toward the optical system and to the left. As such, the second light emitting device 804*b* may be configured to generate a converging radiation pattern that is reduced relative to the third size of the second light emitting device 804*b*. In this regard, the radiation pattern generated by the second light emitting device 804*b* may be efficiently coupled to the second optical system 802*b* despite the difference in sizes of the second light emitting device 804*b* and the second optical system 802*b*.

Figures 9A, 9B:
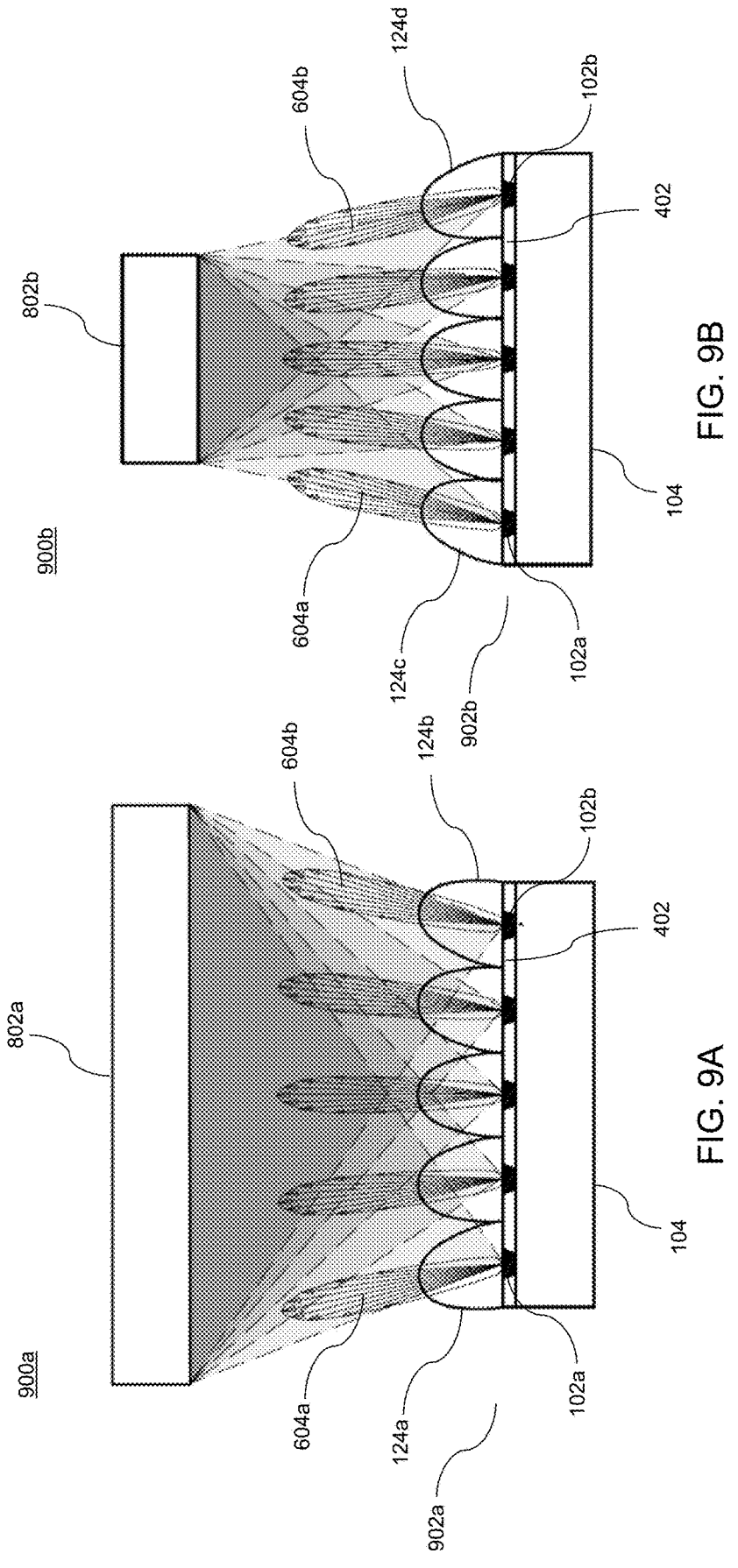
FIG. 9A is a vertical cross-sectional view of a system in which a light emitting device having a flat substrate is configured to generate a diverging radiation pattern, according to various embodiments.
FIG. 9B is a vertical cross-sectional view of a system in which a light emitting device having a flat substrate is configured to generate a converging radiation pattern, according to various embodiments.

FIG. 9A is a vertical cross-sectional view of a first system 900*a* in which a first light emitting device 902*a* having a flat substrate 104 is configured to generate a diverging radiation pattern, and FIG. 9B is a vertical cross-sectional view of a second system 900*b* in which a second light emitting device 902*b* having a flat substrate 104 is configured to generate a converging radiation pattern, according to various embodiments. In this regard, the first light emitting device 902*a* may generate a similar diverging radiation pattern as generated by the first light emitting device 804*a* of FIG. 8A, and the second light emitting device 902*b* may generate a similar converging radiation pattern as generated by the second light emitting device 804*b* of FIG. 8B.

However, in contrast to the first light emitting device 804*a* of FIG. 8A and the second light emitting device 804*b* of FIG. 8B, the light emitting devices (902*a*, 902*b*) of FIGS. 9A and 9B may include micro-lenses having characteristics that vary from position to position. For example, the axis which extends from the middle of the bottom of the micro-lens (i.e., the surface facing the underlying light emitting diode) to the tip of the micro-lens may be tilted to the normal to the bottom of the micro-lens by a non-zero angle. For example, the angle may comprise 1 to 30 degrees. Thus, at least some of the peripheral micro-lenses (124*a*, 124*b*, 124*c*, 124*d*) are tilted to one side. The central micro-lenses may or may not be tilted.

For example, a first micro-lens 124*a* may have a shape that is configured to generate a first radiation pattern 604*a*, based on photons received from a first light emitting diode 102*a*, which is peaked in a direction that is oriented toward the optical system and to the left, as shown in FIG. 9A. Similarly, a second micro-lens 124*b* may have a shape that is configured to generate a second radiation pattern 604*b* that is peaked in a direction that is oriented toward the optical system and to the right, as shown in FIG. 9A. Thus, the micro-lenses (124*a*, 124*b*) are tilted away from a normal to the top of the substrate 104. In this way, the shape of each micro-lens may be chosen as a function of position within the first light emitting device 902*a* to thereby generate the diverging radiation pattern.

In the embodiment of FIG. 9B, a third micro-lens 124*c* may have a shape that is configured to generate a first radiation pattern 604*a*, based on photons received from a first light emitting diode 102*a*, which is peaked in a direction that is oriented toward the optical system and to the right, as shown in FIG. 9B. Similarly, a fourth micro-lens 124*d* may have a shape that is configured to generate a second radiation pattern 604*b* that is peaked in a direction that is oriented toward the optical system and to the left, as shown in FIG. 9B. Thus, the micro-lenses (124*c*, 124*d*) are tilted toward the normal to the top of the substrate 104. In this way, the shape of each micro-lens may be chosen as a function of position within the second light emitting device 902*b* to thereby generate the converging radiation pattern.

However, the above systems 800*a*, 800*b*, 900*a*, 900*b* shown in FIGS. 8A, 8B, 9A and 9B, respectively, may be relatively difficult and expensive to manufacture. In further embodiments, a direction in which a radiation pattern is peaked may be determined by displacement of a micro-lens relative to the underlying light emitting diode, as described in greater detail below. Such systems having micro-lenses offset relative to the respective underlying light emitting diodes are less complex and less expensive to manufacture. As used herein, a light emitting diode which is "underlying" a micro-lens is located facing the flat side of the micro-lens. However, the light emitting diode does not have to be positioned lower to the ground than the micro-lens.

Figure 10A:
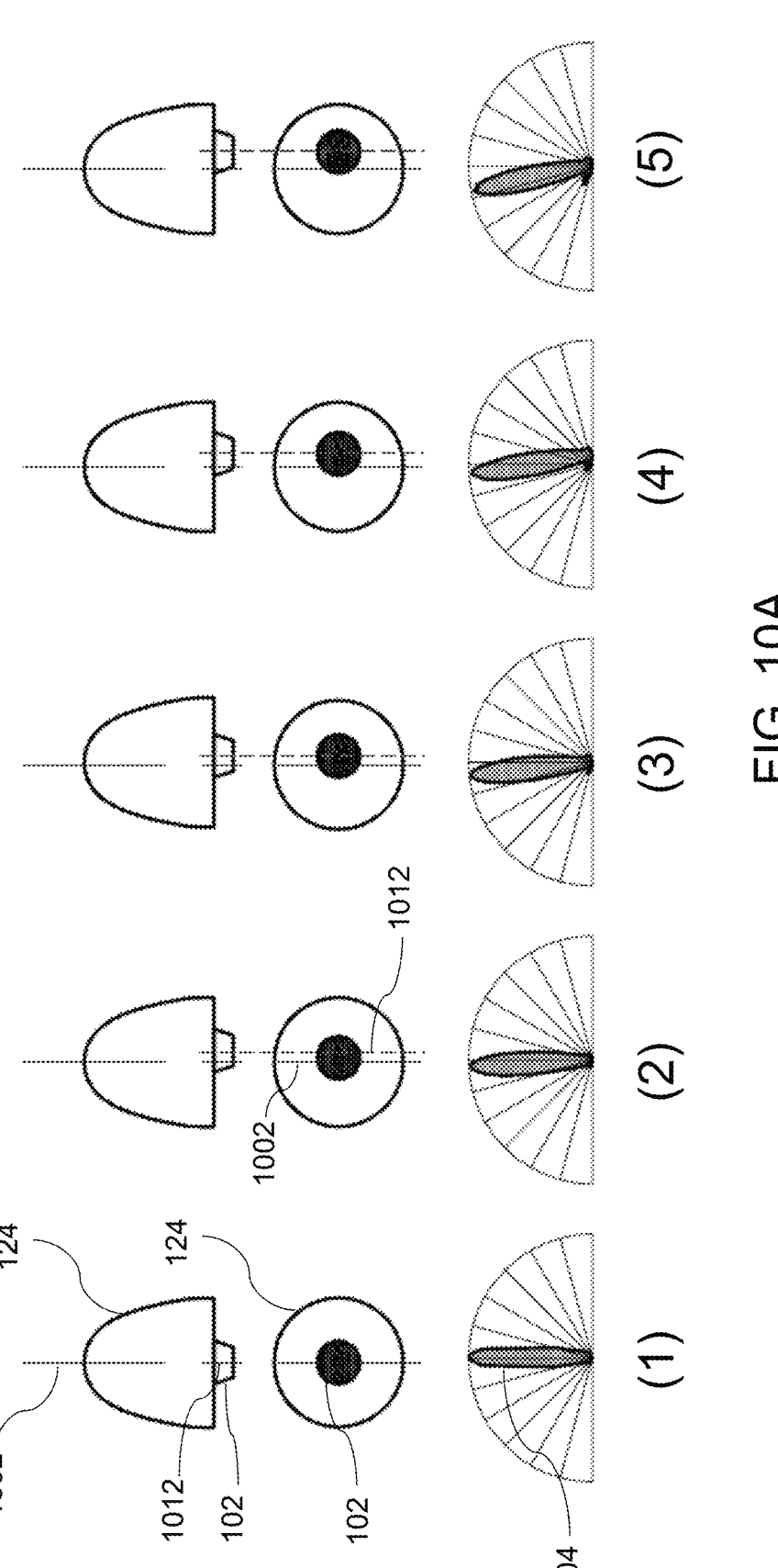
FIG. 10A illustrates a first plurality of configurations of a micro-lens positioned relative to a light emitting diode along with a corresponding plurality of respective radiation patterns, according to various embodiments.

FIG. 10A illustrates a first plurality of configurations of a micro-lens 124 positioned relative to an underlying light emitting diode 102 along with a corresponding plurality of respective radiation patterns, according to various embodiments. In the example simulation shown in FIG. 10A, the micro-lens diameter is 3 microns and the light emitting diode diameter is 1 micron. However, other diameters may also be used. In each of the configurations (1) to (5), the middle row shows a top down view of the micro-lens 124 positioned relative to the light emitting diode 102, and the top row shows a side view of the micro-lens 124 and the light emitting diode 102. The bottom row shows a side view of a radiation pattern 604 for each configuration.

In each of the configurations (1) to (5), the micro-lens 124 may have a first symmetry axis 1002 (drawn as a vertical line in each configuration). The first symmetry axis 1002 is perpendicular to the bottom of the micro-lens 124 and extends from the middle of the bottom of the micro-lens to the tip of the micro-lens 124. The first symmetry axis 1002 may be displaced relative to a second symmetry axis 1012 of the light emitting diode 102 in configurations (2) to (5). In this example, the light emitting diode 102 may be assumed to have a circular cross-sectional shape perpendicular to the second symmetry axis 1012. Therefore, the second symmetry axis 1012 of the light emitting diode 102 corresponds with the center of the light emitting diode 102 of each of configurations (1) to (5). In other embodiments, the micro-lens 124 and the light emitting diode 102 may have various other sizes, shapes, and symmetries.

In one embodiment shown in FIG. 10A, the bottom of the micro-lens 124 may be wider than the top of the light emitting diode 102. In one example, the bottom of the micro-lens 124 may be three times wider than the top of the light emitting diode 102. For example, a first diameter of the micro-lens 124 (i.e., the diameter of the bottom of the micro-lens) may be approximately three times larger than a second diameter of the light emitting diode 102 (i.e., of the top of the light emitting diode). For example, the first diameter may be approximately 9 microns and the second diameter may be approximately 3 microns. In other embodiments, the micro-lens 124 and the light emitting diode 102 may have various other sizes and shapes and the relative ratios of diameters (or widths for non-circular shaped devices) may be different. In one embodiment, all micro-lenses 124 may have the same diameter and the same height. In the first configuration (1), the micro-lens 124 may be aligned with the light emitting diode 102 and therefore has approximately a zero displacement between the first and second symmetry axes. In configurations (2) to (5) the displacements of the micro-lens 124 relative to the light emitting diode 102 (i.e., the displacements of the first and second symmetry axes) are 0.3 microns, 0.6 microns, 0.9 microns, and 1.2 microns, respectively.

As shown in the lower row of FIG. 10A, each lateral displacement of the micro-lens 124 relative to the light emitting diode 102 (i.e., each lateral displacement of the second symmetry axis 1012 relative to the first symmetry axis 1002) generates a radiation pattern that is peaked in a direction that depends on the displacement. The radiation patterns plotted in the lower row of FIG. 10A are based on numerical simulations carried out by the inventor of the instant application. In the first configuration (1) the radiation pattern 604 from the light emitting diode 102 is oriented along the first symmetry axis 1002 of the micro-lens 124. In other words, there is no displacement of the second symmetry axis 1012 relative to the first symmetry axis 1002. In each of the configurations (2) to (5) the radiation pattern is peaked along a direction that oriented at a non-zero angle relative to the to the first symmetry axis 1002. Each of configurations (2) to (5) corresponds to increasing displacements of the micro-lens 124 to the left relative to the light emitting diode 102 (i.e., increasing displacement of the second symmetry axis 1012 relative to the first symmetry axis 1002). The corresponding radiation patterns 604 are similarly peaked to the left at increasing angles relative to the first symmetry axis 1002.

Figure 10B:
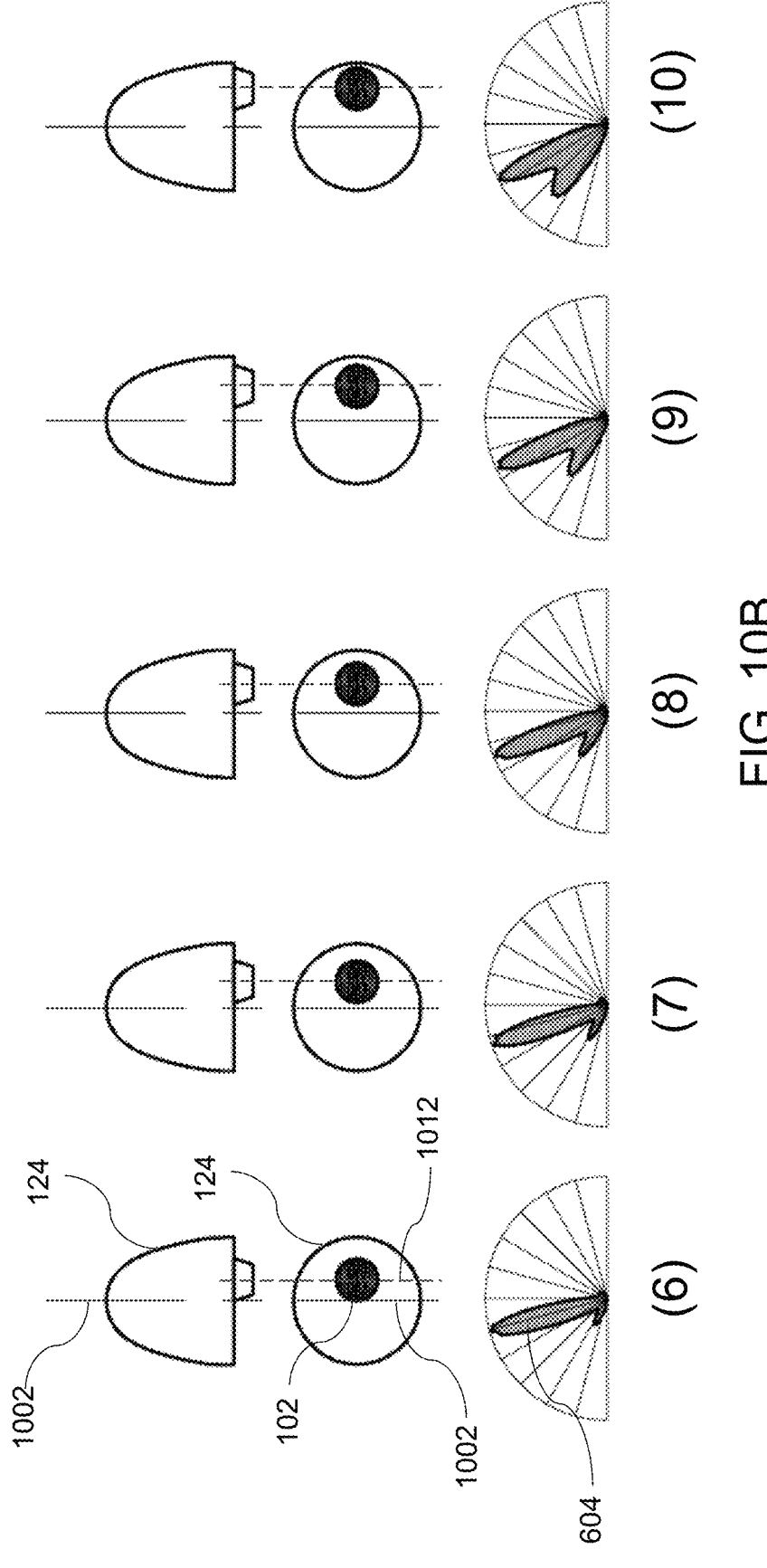
FIG. 10B illustrates a second plurality of configurations of a micro-lens positioned relative to a light emitting diode along with a corresponding plurality of respective radiation patterns, according to various embodiments.

FIG. 10B illustrates a second plurality of configurations of a micro-lens 124 positioned relative to a light emitting diode 102 along with a corresponding plurality of respective radiation patterns 604, according to various embodiments. In each of the configurations (6) to (10), the middle row shows a top down view of a micro-lens 124 positioned relative to a light emitting diode 102, and the top row shows a side view of the micro-lens 124 and the light emitting diode 102. The bottom row shows a side view of the radiation pattern 604 for each configuration. In each of the configurations (6) to (10), the micro-lens 124 may have a first symmetry axis 1002 (drawn as a vertical line in each configuration) that may be displaced relative to a second symmetry axis 1012 of the light emitting diode 102. The size and shape of the micro-lens 124 in each of configurations (6) to (10) is assumed to be the same as the size and shape of the micro-lens 124 in FIG. 10A.

In configurations (6) to (10) the displacements of the micro-lens 124 relative to the light emitting diode 102 are 1.5 microns, 1.8 microns, 2.1 microns, and 2.7 microns, respectively. The peak of the radiation pattern 604 is oriented at an angle with respect to the first symmetry axis 1002 that increases with relative displacement between the light emitting diode 102 and the micro-lens 124 (i.e., the displacement of the second symmetry axis 1012 relative to the first symmetry axis 1002).

Figure 11:
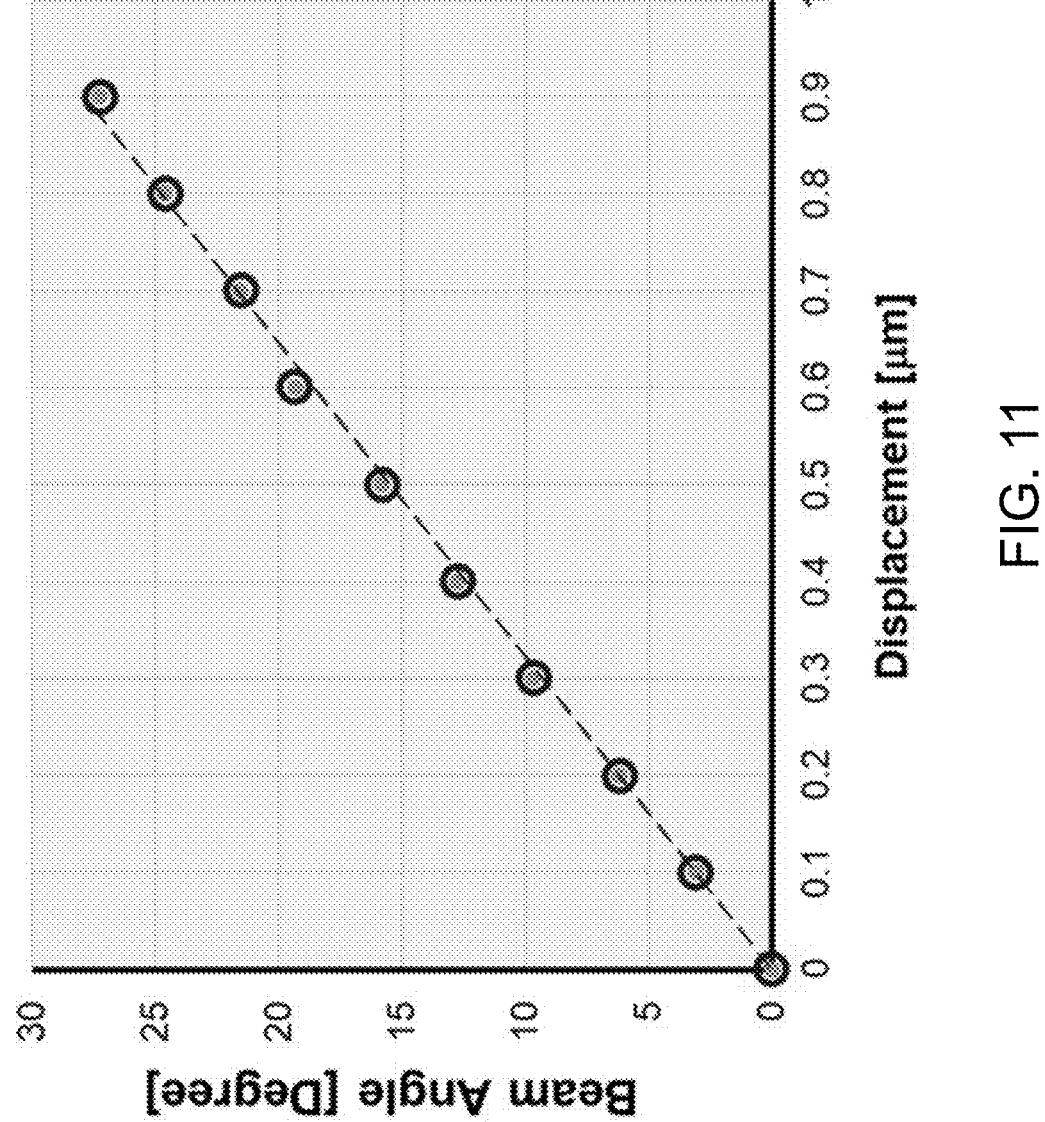
FIG. 11 is a plot of beam angle vs displacement of a micro-lens relative to a light emitting diode, according to various embodiments.

FIG. 11 is a plot of beam angle vs displacement of a micro-lens relative to a light emitting diode (i.e., relative displacement between the first symmetry axis 1002 and the second symmetry axis 1012), according to various embodiments. In this context, the term "beam angle" refers to the angle, relative to the first symmetry axis 1002, at which radiation distribution is peaked. As shown, the direction of the radiation pattern 604 varies as an approximately linear function of the displacement of the first symmetry axis 1002 of the micro-lens 124 relative to the second symmetry axis 1012 of the light emitting diode 102 as shown in FIGS. 10A and 10B. Further, the beam angle varies in a first range from approximately 0 degrees to approximately 30 degrees, relative to a direction of the first symmetry axis 1002, as micro-lens 124 is displaced relative to the light emitting diode 102 in a second range from approximately 0 microns to 1 micron. This indicates that a constant increase in displacement of second symmetry axis 1012 of the light emitting diode 102 from the first symmetry axis (e.g., optical axis) 1002 of the micro-lens does not result in distortion of images. This allows a scale-up or scale-down of either the light emitting diode array or the micro-lens array to either shrink or enlarge the original image.

Figures 12A, 12B, 12C:
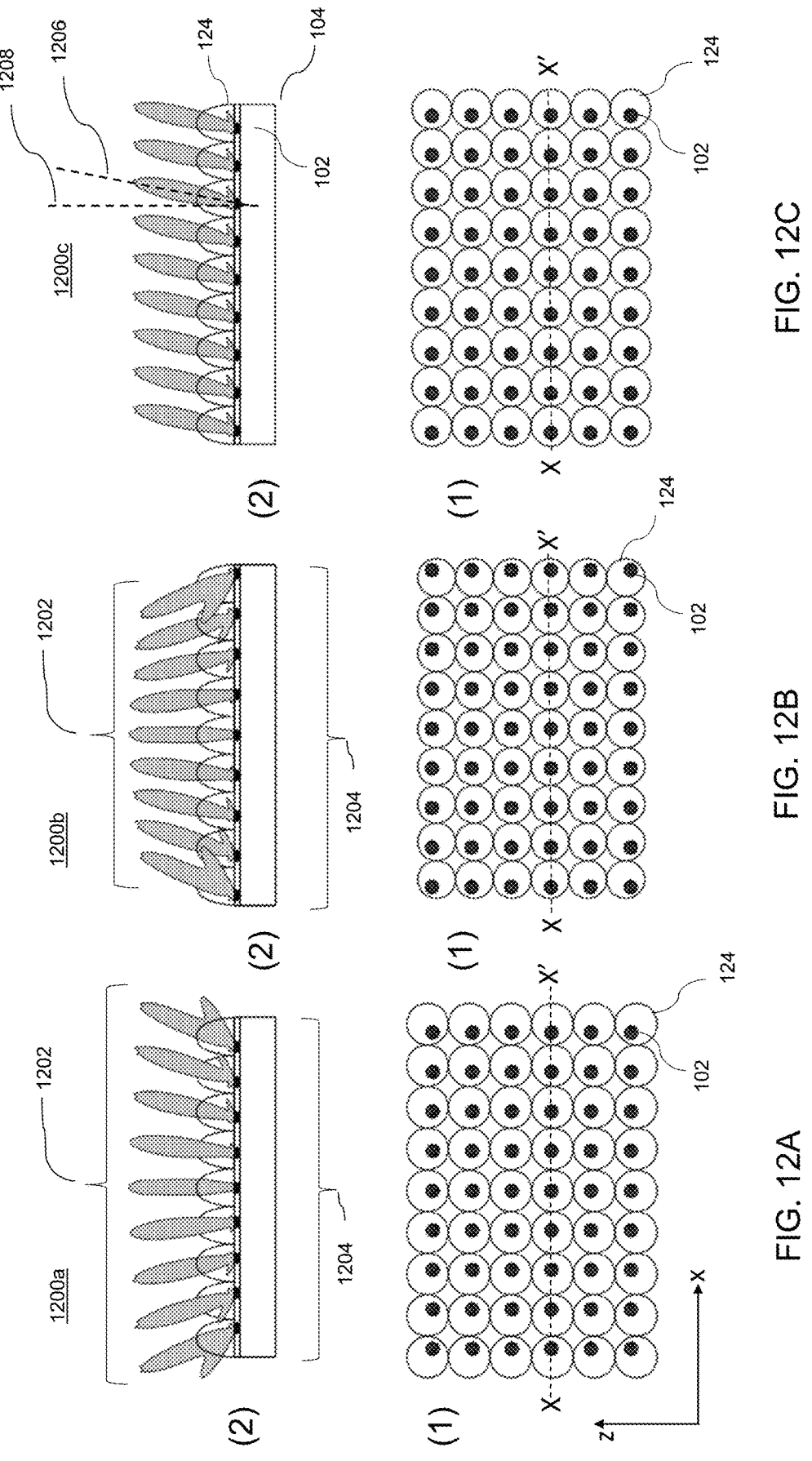
FIG. 12A presents a top view and a vertical cross-sectional view of a light emitting device that is configured to generate a diverging radiation pattern, according to various embodiments.
FIG. 12B presents a top view and a vertical cross-sectional view of a light emitting device that is configured to generate a converging radiation pattern, according to various embodiments.
FIG. 12C presents a top view and a vertical cross-sectional view of a light emitting device that is configured to generate a radiation pattern that is directed at a predetermined angle relative to a direction perpendicular to the light emitting device, according to various embodiments.

FIG. 12A presents a top view (1) and a vertical cross-sectional view (2) along plane X-X' in the top view (1) of a light emitting device 1200*a* that is configured to generate a diverging radiation pattern, according to various embodiments. The diverging radiation pattern may be used to magnify (i.e., enlarge) the original image.

Since each ray is emitted from each light emitting diode at a divergence angle determined by the relative displacement between the light emitting diode and the associated micro-lens, the projected image size 1202 may be increased relative to the size 1204 of the light emitting device 1200*a* according to the propagation distance. As shown, micro-lenses 124 near the center of the array may have very little or no displacement relative to the corresponding light emitting diodes 102. Moving from the middle to the right of the light emitting device 1200*a* along the x direction, however, the displacements from lens to lens increase toward the right. Similarly, moving from the middle to the left along the x direction, the displacements from lens to lens increase toward the right. In this way, the displacements from lens to lens are diverging and thereby generate the diverging radiation distribution. In other words, the light emitting diode array has a smaller period (i.e., spacing) than the micro-lens array in both orthogonal x and z horizontal directions. As can be seen from FIG. 12A, the displacements from lens to lens also diverge from the middle in the z direction. In this regard, moving from the middle upward in the z direction, the displacements from lens to lens increase toward the upward direction, and moving from the middle downward in the z direction, the displacements from lens to lens increase toward the downward direction.

FIG. 12B presents a top view (1) and a vertical cross-sectional view (2) along plane X-X' in the top view (1) of a light emitting device 1200*b* that is configured to generate a converging radiation pattern, according to various embodiments. The displacement of each micro-lens 124 varies from lens to lens such that the light emitting device 1200*b* generates a projected image having a first size 1202 that is reduced (i.e., shrunk) relative to a second size 1204 of the light emitting device 1200*b*. As shown, micro-lenses 124 near the center of the array have very little or no displacement relative to the corresponding light emitting diodes 102. Moving from the middle to the right along the x direction of the light emitting device 1200*a*, however, the displacements from lens to lens increase toward the left. Similarly, moving from the middle to the left along the x direction, the displacements from lens to lens increase toward the right. In other words, the light emitting diode array has a larger period (i.e., spacing) than the micro-lens array in both orthogonal x and z horizontal directions. As can be seen from FIG. 12B, the displacements from lens to lens follow a similar pattern in the z direction. In this regard, moving from the middle upward in the z direction, the displacements from lens to lens increase toward the downward direction, and moving from the middle downward in the z direction, the displacements from lens to lens increase toward the upward direction.

FIG. 12C presents a top view (1) and a vertical cross-sectional view (2) along plane X-X' in the top view (1) of a light emitting device 1200c that is configured to generate a radiation pattern that is directed at a predetermined angle (i.e., slanted) relative to a direction perpendicular to the plane of the top surface of the substrate supporting light emitting device, according to various embodiments. In this example, the displacement of each micro-lens has a common value such that the light emitting device 1200c generates an image that is peaked in a first direction 1206 that is oriented at an angle relative to a second direction 1208 that is perpendicular to a surface of a substrate 104 on which the plurality of light emitting diodes 102 are formed. In this example, each of the micro-lenses 124 is displaced to the right along the x direction, relative to the light emitting diode 102, by an approximately equal amount. In other words, the light emitting diode array has the same period (i.e., spacing) than the micro-lens array in both orthogonal x and z horizontal directions. However, the first symmetry axis 1002 is offset from the second symmetry axis 1012 by a predetermined amount in each pair of micro-lens 124 and underlying light emitting diode 102.

Therefore, according to embodiments of invention, is the image projection direction and/or image size can be changed achieved by changing the relative axis offset and/or the relative period between the micro-lens array and the light emitting diode array, without changing the lens design and light emitting diode array. In other words, the same light emitting diode array and lens geometry can be reused to generate various sizes of projected images or radiation angles.

Figure 14:
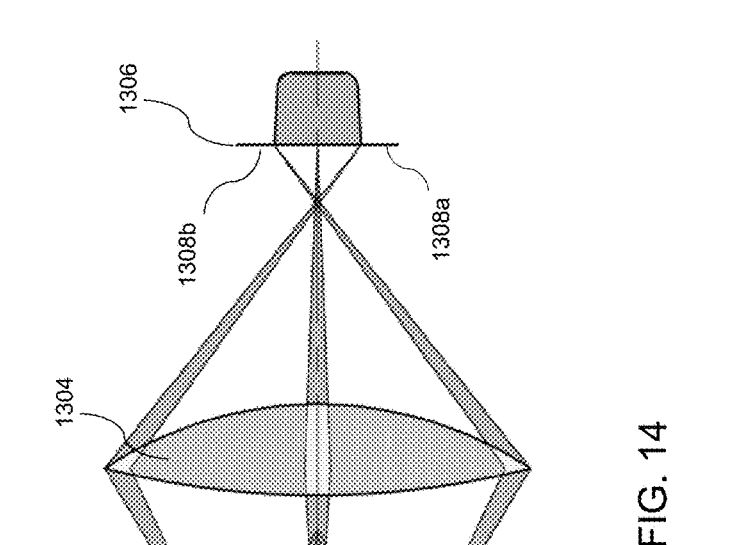
FIG. 14 illustrates image formation based on radiation generated by light sources that each generate a peaked radiation distribution, according to various embodiments.
Figure 13:
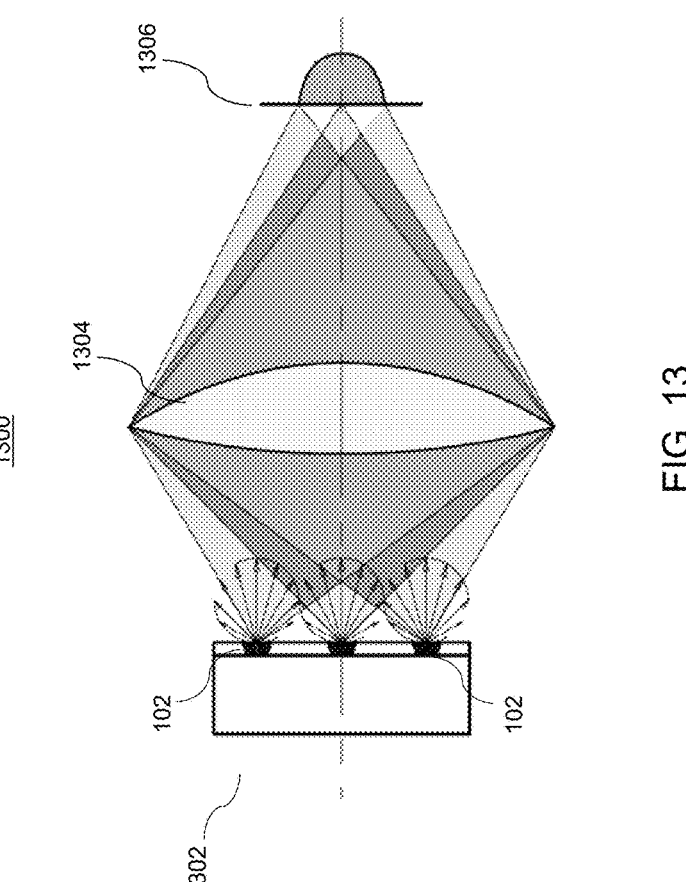
FIG. 13 illustrates image formation based on radiation having a Lambertian radiation distribution, according to various embodiments.

FIG. 13 illustrates image formation based on radiation having a Lambertian radiation distribution, and FIG. 14 illustrates image formation based on radiation generated by light sources that each generate a peaked radiation distribution, according to various embodiments. As described in greater detail below, the system 1400 of FIG. 14 generates more uniform images, using radiation sources that each generate a peaked radiation distribution, than may be generated by the system 1300 of FIG. 13. The systems 1300 and 1400 may comprise virtual reality display systems, augmented reality display systems or heads up display systems.

The system 1300 of FIG. 13 may include a light emitting device 1302 having light sources (e.g., light emitting diodes 102) that each generate a Lambertian radiation distribution. The system 1300 may further include an optical system 1304 (e.g., a lens or other optical component) and a screen 1306 (or other optical component, detector, etc.) on which an image may be formed. Each light emitting diode 102 may generate a radiation pattern having a Lambertian distribution, which as described above, is a distribution in which emitted radiation intensity (i.e., photons per unit area) varies as the cosine of an angle between the emission direction and a direction perpendicular to the emitting surface (e.g., see FIG. 3 and related description).

As such, the optical system 1304 receives photons from each light emitting diode 102 over a range of angles. The optical system 1304 focuses the received photons over a corresponding range of positions on the screen 1306 based on the angles of incidence of the received photons. Thus, radiation generated by a particular light emitting diode 102 gives rise to light that is spread over a certain area of the screen 1306. In this regard, radiation from the various light emitting diodes 102 generates an image that is diffuse due to overlap of radiation on the screen 1306, received from different light emitting diodes 102, due to the range of incident angles of radiation emitted from each light source.

The system 1400 of FIG. 14 may include a light emitting device 1402 that may include light sources that each emit radiation having a peaked distribution. The system 1400 may further include an optical system 1304 (e.g., a lens or other optical component) and a screen 1306 (or other optical component, detector, etc.) on which an image may be formed. The light sources may include a plurality of light emitting diodes 102. For example, a first light emitting diode 102a may be configured using a respective micro-lens 124 to generate a first radiation pattern 604a that has a narrow angular distribution that is peaked in a first direction. The system may further include a second light emitting diode 102b that is configured (e.g., using another micro-lens 124, which is not shown for clarity) to generate a second radiation pattern 604b that has a narrow angular distribution that is peaked in a second direction.

As described above, the narrow distribution patterns (604a, 604b) may be generated by micro-lenses (not shown in FIG. 14) that are configured to receive radiation generated by the light emitting diodes (102a, 102b) and to direct that radiation into predetermined directions. In this example, as shown in FIG. 14, the radiation pattern generated by the light emitting device 1402 may have a diverging spatial distribution (e.g., see FIGS. 8A, 9A, 12A, and related description) and may be configured to efficiently couple with the optical system 1304, which may have a size that is larger than a size of the light emitting device 1402.

The light sources in the light emitting device 1402 may generate an image on the screen 1306 due to the localized radiation patterns (604a, 604b) generated by each of the light emitting diodes (102a, 102b). In this regard, the first radiation pattern 604a may be received by the optical system 1304, which may generate from the received first radiation pattern 604a a first well-localized spot 1308a on the screen 1306. Similarly, the second radiation pattern 604b may be received by the optical system 1304, which may generate from the received second radiation pattern 604b a second well-localized spot 1308b on the screen 1306. The resulting image projected onto the screen 1306 may have a higher quality than the image generated by the system 1300 of FIG. 13 due to reduced overlap of radiation on the screen emitted from different sources.

The above-described embodiments provide various advantages over conventional systems. In this regard, lenses (e.g., micro-lenses) may be used to modify radiation patterns generated by individual radiation sources. As such, the efficiency of optical coupling between light emitting devices and optical components may be increased. In this regard, a size, shape, and direction of a radiation distribution may be configured so that the radiation may be coupled into optical components with increased efficiency. Further, the use of radiation sources that each generate a radiation field that has a narrow angular distribution may be used to form higher quality images due to reduced overlap of radiation generated by different sources, in contrast to conventional systems that use light sources that generate radiation having a Lambertian distribution.

The preceding description of the disclosed embodiments is provided to enable persons of ordinary skill in the art to make or use the disclosed embodiments. Various modifications to these embodiments will be readily apparent to those of ordinary skill in the art, and the generic principles defined herein may be applied to other embodiments without departing from the spirit or scope of the disclosure. Thus, the disclosure is not intended to be limited to the embodiments shown herein but is to be accorded the widest scope consistent with the following claims and the principles and novel features disclosed herein.

What is claimed is:

1. A light emitting device, comprising:
a substrate;
a plurality of light emitting diodes located over the substrate; and
a plurality of micro-lenses, wherein each of the plurality of micro-lenses is located over a respective one of the plurality of light emitting diodes,
wherein each of the plurality of micro-lenses has a first symmetry axis, each of the plurality of light emitting diodes has a second symmetry axis, and at least some of the plurality of micro-lenses have the first symmetry axis which is laterally displaced relative to the second symmetry axis of the respective one of the plurality of light emitting diodes,
wherein:
the plurality of light emitting diodes is configured as an ordered array of pixels with each pixel comprising a red subpixel, a blue subpixel, and a green subpixel;
the substrate includes electrical circuitry configured to control the plurality of light emitting diodes such that the light emitting device is configured as a display that generates an image; and
a spatial extent of the image is determined by displacements of the plurality of micro-lenses relative to the respective light emitting diodes, and
a displacement of each of the plurality of micro-lenses varies from lens to lens such that the light emitting device generates the image having a first size that is enlarged relative to a second size of the light emitting device.

2. The light emitting device of claim 1, wherein the plurality of light emitting diodes are arranged in a first array, the plurality of micro-lenses are arranged in a second array, and the first array has a smaller period than the second array in two orthogonal directions which are parallel to a top surface of the substrate.

3. The light emitting device of claim 1, wherein the plurality of light emitting diodes are arranged in a first array, the plurality of micro-lenses are arranged in a second array, and the first array has a larger period than the second array in two orthogonal directions which are parallel to a top surface of the substrate.

4. The light emitting device of claim 1, wherein the displacement of each of the plurality of micro-lenses has a common value such that the light emitting device generates the image that is directed at an angle relative to a direction perpendicular to a surface of the substrate on which the plurality of light emitting diodes is formed.

5. The light emitting device of claim 4, wherein the plurality of light emitting diodes are arranged in a first array, the plurality of micro-lenses are arranged in a second array, and the first array has a same period as the second array in two orthogonal directions which are parallel to a top surface of the substrate.

6. The light emitting device of claim 5, wherein all the plurality of micro-lenses have the first symmetry axis which is laterally displaced relative to the second symmetry axis of the respective one of the plurality of light emitting diodes.

7. The light emitting device of claim 1, further comprising:
a plurality of optical cavities each bounded by a cavity wall, wherein each of the plurality of light emitting diodes is located in a respective optical cavity and is configured to emit blue or ultraviolet radiation incident photons; and
a color conversion material located over each of the plurality of light emitting diodes that is configured to absorb the incident photons emitted by the light emitting diode and to generate converted photons having a longer peak wavelength than a peak wavelength of the incident photons.

8. The light emitting device of claim 1, wherein each of the plurality of micro-lenses is configured to receive photons generated by the respective one of the plurality of light emitting diodes, and to form a radiation pattern of the photons that is peaked in a predetermined direction that is determined based on a lateral displacement of the first symmetry axis of the micro-lens relative to the second symmetry axis of the respective one of the plurality of light emitting diodes.

9. The light emitting device of claim 8, wherein the predetermined direction varies in a first range from greater than 0 degrees to 30 degrees, relative to a direction of the first symmetry axis, as the first symmetry axis is laterally displaced relative to the second symmetry axis in a second range from greater than 0 microns to 1 micron.

10. The light emitting device of claim 8, wherein the predetermined direction varies as an approximately linear function of the displacement of the first symmetry axis relative to the second symmetry axis.

11. The light emitting device of claim 1, wherein a first diameter of each of the plurality of micro-lenses is approximately larger than a second diameter of a respective one of the plurality of light emitting diodes.

12. The light emitting device of claim 11, wherein the first diameter is 9 microns or less and the second diameter is 3 microns or less.

13. The light emitting device of claim 11, wherein all of the plurality of micro-lenses have a same diameter and a same height.

14. The light emitting device of claim 1, wherein the light emitting device comprises a display device.

15. The light emitting device of claim 14, wherein the display device comprises a virtual reality display device.

16. The light emitting device of claim 14, wherein the display device comprises an augmented reality display device.

17. The light emitting device of claim 14, wherein the display device comprises a heads up display device.

* * * * *